United States Patent
Hayashi et al.

(10) Patent No.: US 9,184,195 B2
(45) Date of Patent: Nov. 10, 2015

(54) COLOR IMAGING ELEMENT AND IMAGING DEVICE

(71) Applicant: FUJIFILM Corporation, Tokyo (JP)

(72) Inventors: Kenkichi Hayashi, Saitama (JP); Seiji Tanaka, Saitama (JP); Noriko Kawamura, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,244

(22) Filed: Jan. 5, 2015

(65) Prior Publication Data

US 2015/0109492 A1   Apr. 23, 2015

Related U.S. Application Data

(63) Continuation of application No. PCT/JP2013/055193, filed on Feb. 27, 2013.

(30) Foreign Application Priority Data

Jul. 6, 2012   (JP) .................................. 2012-152677

(51) Int. Cl.
 H04N 5/228 (2006.01)
 H01L 27/146 (2006.01)
 H04N 9/04 (2006.01)
(52) U.S. Cl.
 CPC .... *H01L 27/14621* (2013.01); *H01L 27/14605* (2013.01); *H04N 9/045* (2013.01)

(58) Field of Classification Search
 CPC .......................... H04N 9/045; H01L 27/14605
 USPC .......................................................... 348/277
 See application file for complete search history.

(56) References Cited

U.S. PATENT DOCUMENTS

| | | |
|---|---|---|
| 5,889,554 A | 3/1999 | Mutze |
| 7,123,299 B1 | 10/2006 | Yoshida et al. |
| 2002/0149686 A1 | 10/2002 | Taubman |
| 2009/0200451 A1 | 8/2009 | Conners |
| 2011/0013054 A1 | 1/2011 | Myhrvold |
| 2012/0293694 A1 | 11/2012 | Hayashi et al. |

FOREIGN PATENT DOCUMENTS

| | | |
|---|---|---|
| EP | 17936201 A1 | 6/2007 |
| JP | 2-210996 A | 8/1990 |
| JP | 8-23543 A | 1/1996 |

(Continued)

OTHER PUBLICATIONS

Extended European Search Report dated Aug. 4, 2014, for European Application No. 11859479.5

(Continued)

*Primary Examiner* — Joel Fosselman
(74) *Attorney, Agent, or Firm* — Birch, Stewart, Kolasch & Birch, LLP

(57) ABSTRACT

According to a color imaging element and an imaging device of the present invention, it is possible to simplify processing in a subsequent stage compared to the case of a random array, improve reproduction precision of de-mosaic processing in a high frequency range, facilitate de-mosaic processing as a result of increase in types of peripheral colors, discern a direction with high correlation between a horizontal direction and a vertical direction, and suppress aliasing upon de-mosaic processing.

17 Claims, 20 Drawing Sheets

(56) References Cited

FOREIGN PATENT DOCUMENTS

| JP | 11-285012 | A | 10/1999 |
|---|---|---|---|
| JP | 2000-308071 | A | 11/2000 |
| JP | 2000-308080 | A | 11/2000 |
| JP | 2005-136766 | A | 5/2005 |
| JP | 5054856 | B1 | 10/2012 |

OTHER PUBLICATIONS

Extended European Search Report dated Jan. 27, 2015, for European Application No. 12804973.1.

Extended European Search Report dated Oct. 28, 2014, for European Application No. 11859950.5.

Hirakawa et al., "Spatio-Spectral Color Filter Array Design for Optimal Image Recovery", IEEE Transactions on Image Processing, vol. 17, No. 10, Oct. 2008, pp. 1876-1890.

International Search Report, mailed Apr. 9, 2013, issued in PCT/JP2013/055193.

Written Opinion of the International Searching Authority, mailed Apr. 9, 2013, issued in PCT/JP2013/055193.

German Office Action dated Sep. 11, 2015, issued in German Patent Application No. 11 2013 003 464.6 (partial translation).

FIG.8
(a) 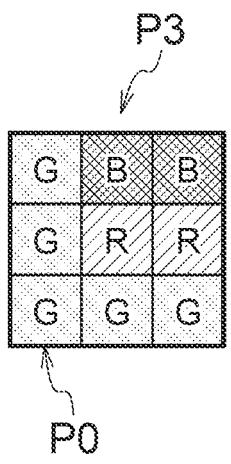
(b) 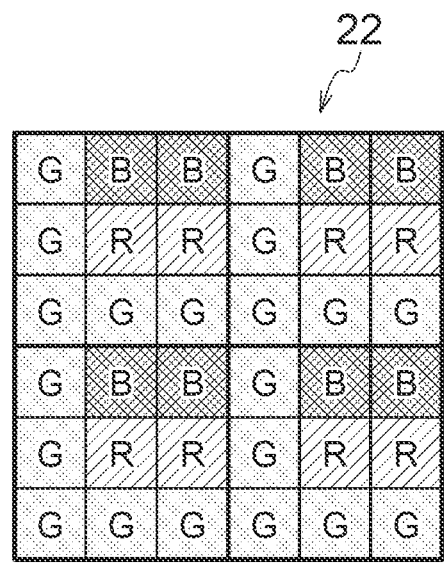
FIG.9
(a) 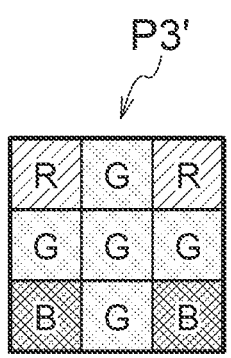
(b) 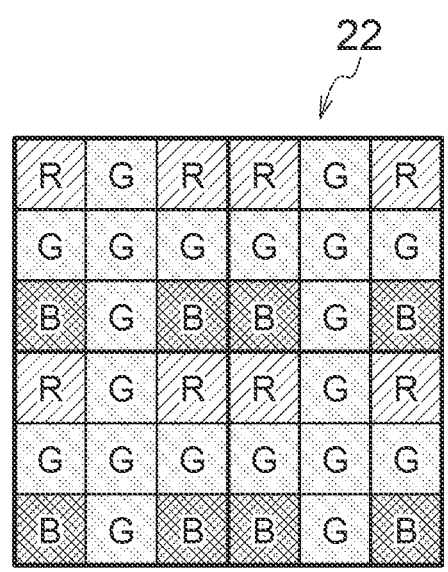

FIG.14
(a) 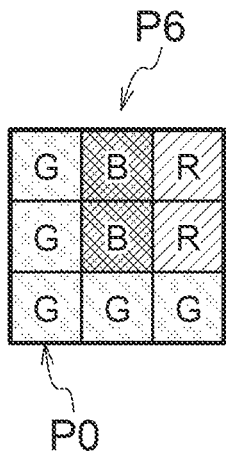
(b) 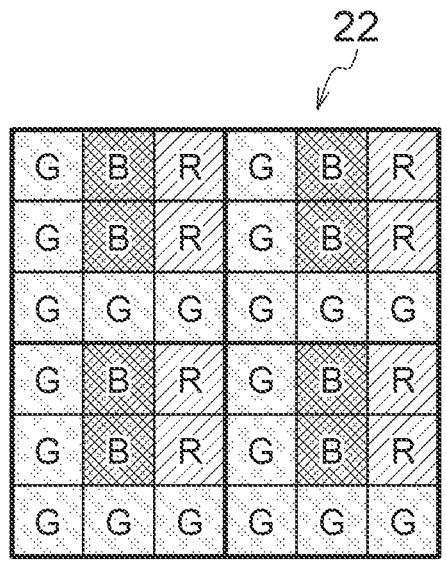
FIG.15
(a) 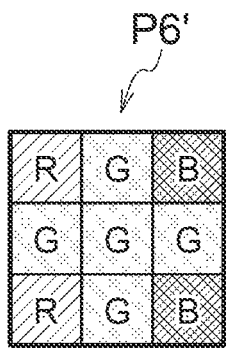
(b) 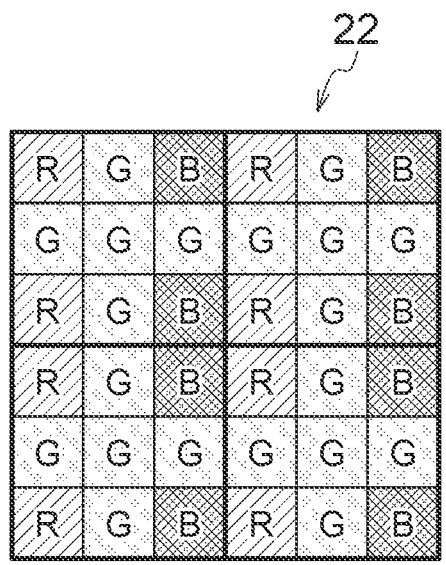

FIG.16
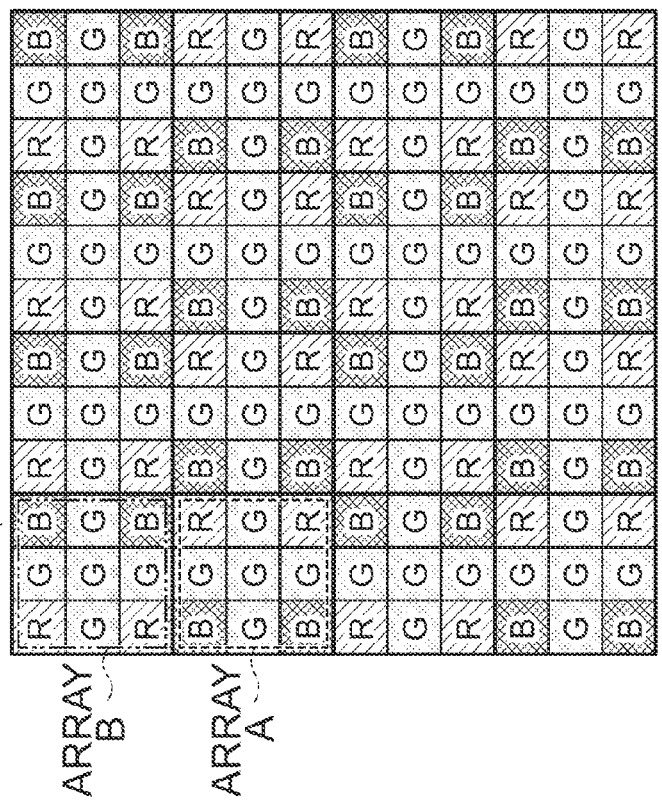
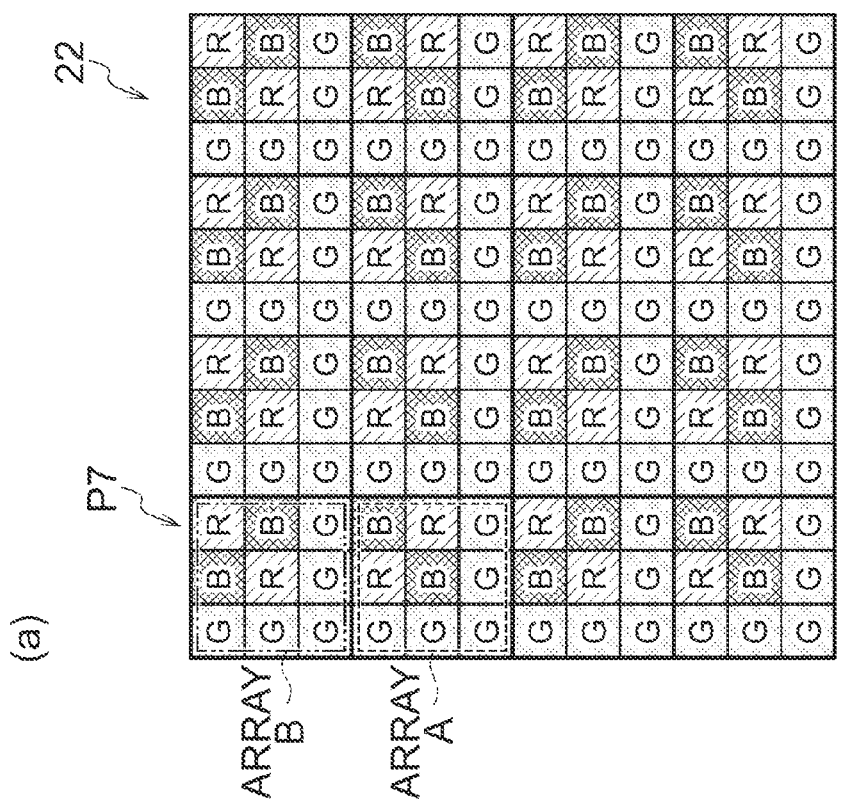

FIG.17
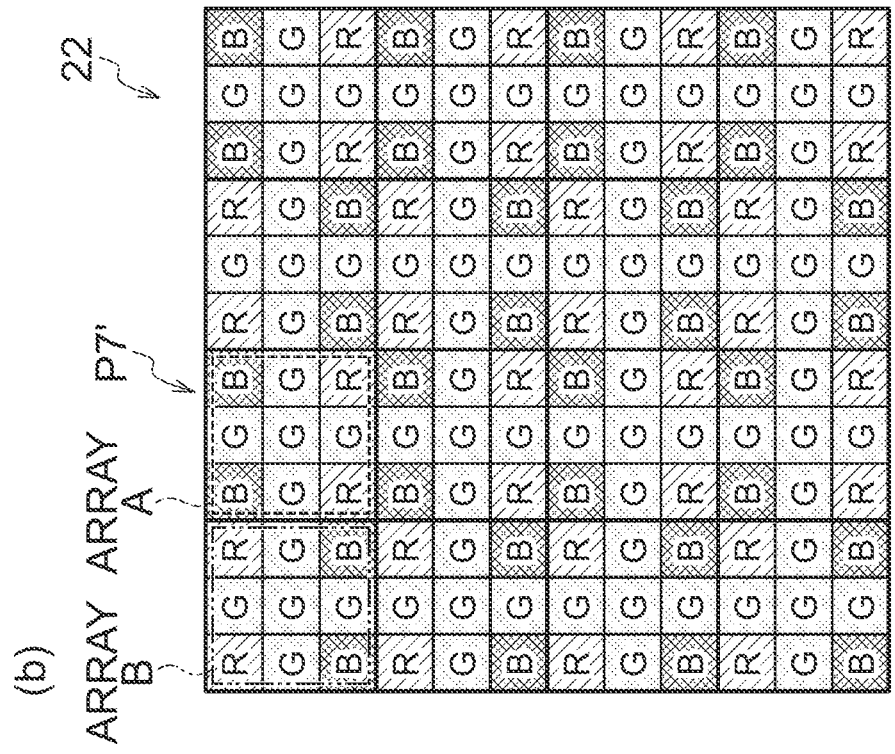
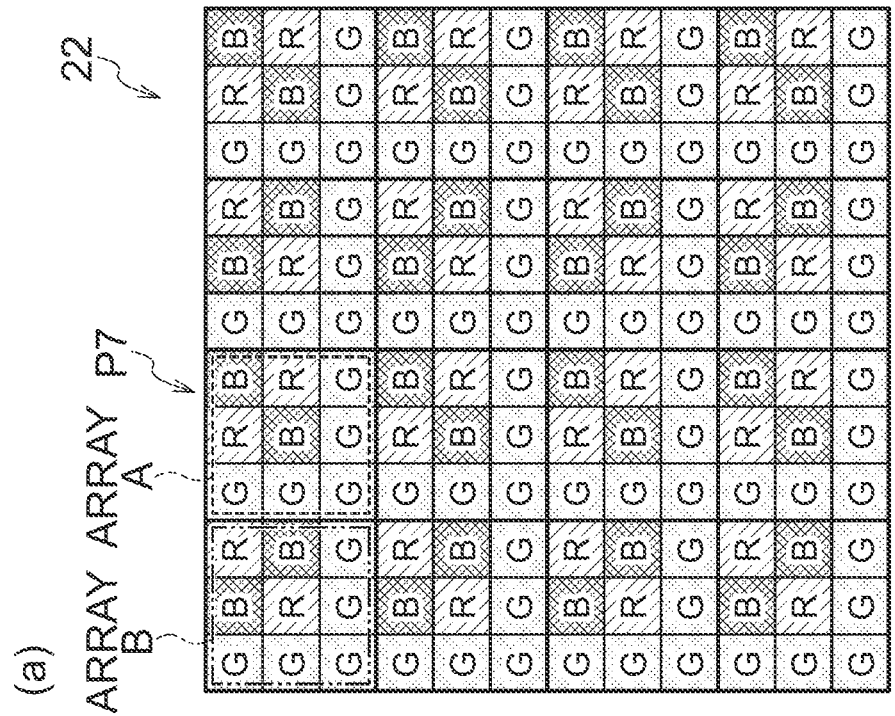

FIG.18
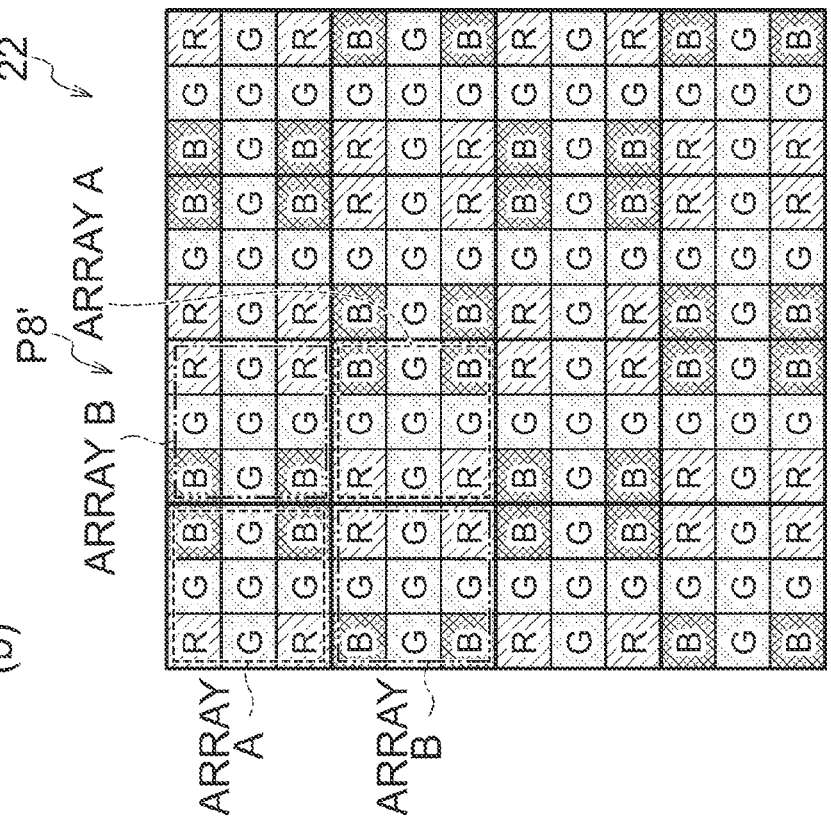
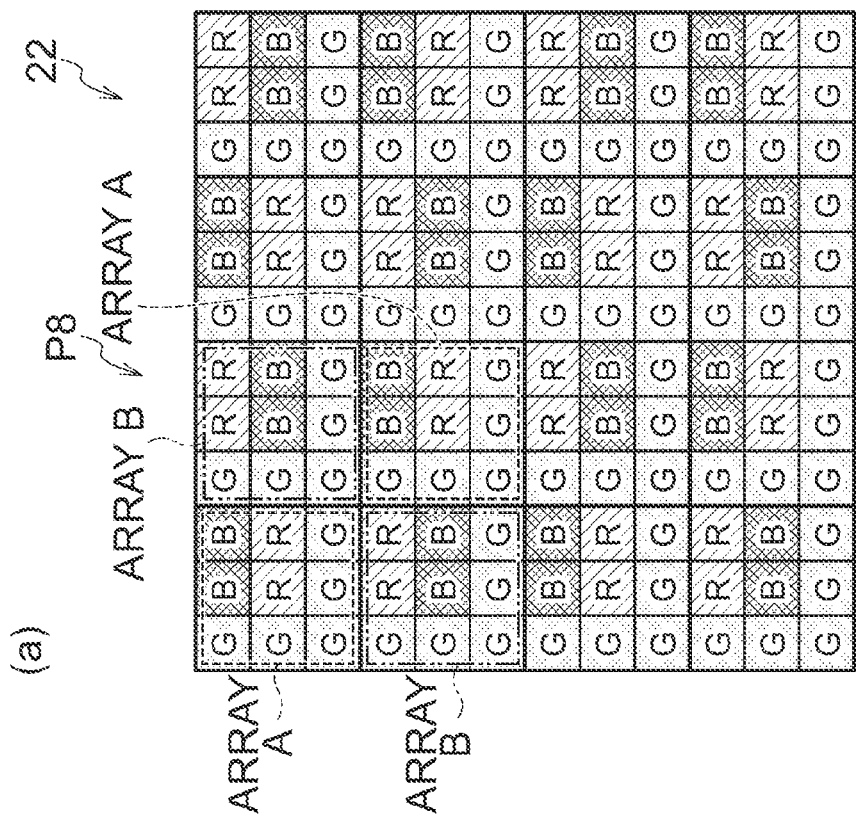

FIG.19

COLOR IMAGING ELEMENT AND IMAGING DEVICE

CROSS-REFERENCE TO RELATED APPLICATIONS

This application is a Continuation of PCT International Application No. PCT/JP2013/055193 filed on Feb. 27, 2013, which claims priority under 35 U.S.C. §119(a) to Japanese Patent Application No. 2012-152677 filed on Jul. 6, 2012. Each of the above application(s) is hereby expressly incorporated by reference, in its entirety, into the present application.

BACKGROUND OF THE INVENTION

1. Field of the Invention

The present invention relates to a color imaging element and an imaging device, and, more particularly, to a color imaging element which can reduce occurrence of color moire and which can realize high resolution, and an imaging device using this color imaging element.

2. Description of the Related Art

In a single plate color imaging element, because a single color filter is provided on each pixel, each pixel has only color information of a single color. Therefore, an output image of the single plate color imaging element is a RAW image (mosaic image), and, thus, processing (de-mosaic processing) for interpolating a pixel of a missing color with peripheral pixels is performed to obtain a multichannel image. In this case, there is a problem in reproduction characteristics of an image signal of a high frequency, and because, with color imaging elements, aliasing is more likely to occur in the taken image than with black-and-white imaging elements, realizing high resolution by expanding a reproduction band while suppressing occurrence of color moire (false color) is an important issue.

Because a primary color Bayer array which is a color array of the color filters most-widely used in the single plate color imaging element is an array in which green (G) pixels are arranged in a checkerboard design and red (R) and blue (B) pixels are arranged in a line-sequential manner, there is a problem in reproduction precision upon generation of a high frequency signal in which a G signal is in a diagonal direction and R and B signals are in horizontal and vertical directions.

When a black-and-white vertically-striped pattern (high frequency image) as shown in FIG. 25(A) is incident on color imaging elements having color filters with a Bayer array shown in FIG. 25(B), if colors are compared by being sorted by the color Bayer array, as shown in FIGS. 25(C) to 25(E), R becomes a light plain color image, B becomes a dark plain color image, and G becomes a gray-scaled mosaic color image, and thus an image which should have originally been a black-and-white image, and which should not have included a difference in concentration (difference in level) among R, G and B, is colored depending on a color array and an input frequency.

In a similar manner, when a diagonal black-and-white high frequency image as shown in FIG. 26(A) is incident on imaging elements having color filters with a Bayer array shown in FIG. 26(B), if colors are compared by being sorted by the color Bayer array, as shown in FIG. 26(C) to 26(E), R and B become light plain color images, and G becomes a dark plain color image, and if a value of black is set to 0, and a value of white is set to 255, because only G is 255 in the diagonal black-and-white high frequency image, the diagonal black-and-white high frequency image becomes green. In this way, it is impossible to correctly reproduce a diagonal high frequency image with the Bayer array.

Typically, in an imaging device using a single plate color imaging element, a high frequency is avoided by disposing an optical low-pass filter comprised of birefringent substance such as a crystal on the front of the color imaging element so that the high frequency is optically removed. However, such a method has a problem that while it is possible to reduce coloring due to folding of a high frequency signal, resolution degrades as its adverse effect.

To solve such a problem, there has been proposed a color imaging element in which a color filter array of the color imaging element is arranged in a three-color random array which satisfies an array restriction condition that an arbitrary target pixel is adjacent to three colors including a color of the target pixel at any of four sides of the target pixel (Japanese Patent Application Laid-Open No. 2000-308080; PTL 1).

Further, there has been proposed an image sensor (color imaging element) with a color filter array, which has a plurality of filters with different spectral sensitivity, and in which, among the filters, a first filter and a second filter are alternately arranged in one of diagonal directions of a pixel lattice of the image sensor in a first predetermined cycle and are alternately arranged in the other of the diagonal directions in a second predetermined cycle (Japanese Patent Application Laid-Open No. 2005-136766; PTL 2).

Still further, there has been proposed a color array of a color solid-state imaging element (color imaging element) having three primary colors of RGB, in which sets of three pixels of horizontally arranged R, G and B are arranged while the sets are displaced in a zig-zag manner in a vertical direction, so that probabilities of appearance of RGB are made equal and an arbitrary line (horizontal, vertical or diagonal line) on the imaging face is made to pass all the colors (Japanese Patent Application Laid-Open No. 11-285012; PTL 3).

Yet further, there has been proposed a color imaging element in which among the three primary colors of RGB, R and B are arranged every third pixel in a horizontal direction and in a vertical direction, and G is arranged between R and B (Japanese Patent Application Laid-Open No. 8-23543; PTL 4).

SUMMARY OF THE INVENTION

The color imaging element disclosed in PTL 1 has a problem that because the filter array is random, when de-mosaic processing is performed in a subsequent stage, it is necessary to perform optimization for each random pattern, which makes the de-mosaic processing complicated. Further, while the random array is effective for color moire in a lower frequency, the random array is not effective for a false color in a high frequency portion. Here, the de-mosaic processing which is processing for calculating (and simultaneously converting) all the color information of RGB for each pixel from a mosaic image of RGB associated with the color filter array of a single plate color imaging element, is also called demosaicing processing or synchronization processing (which are the same in the present specification).

Further, the color imaging element disclosed in PTL 2 has a problem that because G pixels (brightness pixels) are arranged in a checkerboard design, pixel reproduction precision is not good in a limiting resolution area (particularly in a diagonal direction).

While the color imaging element disclosed in PTL 3 has an advantage that it is possible to suppress occurrence of a false color because filters of all the colors exist on an arbitrary line, there is a problem that because a ratio of the number of pixels is equal among R, G and B, high frequency reproducibility degrades compared to the case of the Bayer array. It should be noted that, in the case of the Bayer array, the ratio of the number of pixels of G which contributes most to obtain a brightness signal is twice as high as the respective ratios of the numbers of pixels of R and B.

Meanwhile, in the color imaging element disclosed in PTL 4, a ratio of the number of pixels of G is six times as high as the respective ratios of the numbers of pixels of R and G, which is very high compared to the case of the Bayer array, and therefore color reproducibility degrades.

The present invention has been made in view of the foregoing circumstances, and an object thereof is to provide a color imaging element which can suppress occurrence of a false color and which can realize high resolution, and which can simplify processing in a subsequent stage compared to the case of the conventional random array. Further, an object of the present invention is to provide an imaging device using this color imaging element.

One aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an integer of three or greater) pixels in the first direction and in the second direction, the basic array pattern is repeatedly disposed in the first direction and in the second direction, the color filters include a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of the number of pixels of each color of the second color corresponding to the second filter, and in the basic array pattern, the first filter is disposed in a peripheral portion configuring two adjacent sides among four sides of the array pattern corresponding to the M×M (where M is an integer of three or greater) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an integer of three or greater) pixels in the first direction and in the second direction, the basic array pattern is repeatedly disposed in the first direction and in the second direction, the color filters include a first filter corresponding to a first color of one or more colors whose peak of transmittance falls within a range of a wavelength between 480 nm and 570 nm, and a second filter corresponding to a second color of two or more colors whose peak of transmittance falls outside the range, a ratio of the number of all pixels of the first color corresponding to the first filter is higher than a ratio of the number of pixels of each color of the second color corresponding to the second filter, and in the basic array pattern, the first filter is disposed in a peripheral portion configuring two adjacent sides among four sides of the array pattern corresponding to the M×M (where M is an integer of three or greater) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an integer of three or greater) pixels in the first direction and in the second direction, the basic array pattern is repeatedly disposed in the first direction and in the second direction, the color filters include a first filter corresponding to a first color of one or more colors, and a second filter corresponding to a second color of two or more colors, transmittance of the second filter being lower than transmittance of the first filter within a range of a wavelength between 500 nm and 560 nm, a ratio of the number of all pixels of the first color corresponding to the first filter is higher than a ratio of the number of pixels of each color of the second color corresponding to the second filter, and in the basic array pattern, the first filter is disposed in a peripheral portion configuring two adjacent sides among four sides of the array pattern corresponding to the M×M (where M is an integer of three or greater) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an integer of three or greater) pixels in the first direction and in the second direction, the basic array pattern is repeatedly disposed in the first direction and in the second direction, the color filters include a first filter corresponding to a first color of two or more colors including a color most contributing to a brightness signal among three primary colors and a fourth color different from the three primary colors, and a second filter corresponding to a second color of two or more colors other than the first color, a ratio of the number of all pixels of the first color corresponding to the first filter is higher than a ratio of the number of pixels of each color of the second color corresponding to the second filter, and in the basic array pattern, the first filter is disposed in a peripheral portion configuring two adjacent sides among four sides of the array pattern corresponding to the M×M (where M is an integer of three or greater) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides.

According to these aspects, because the first filter is disposed in one or more pixels within a line of each direction of first to fourth directions of the array of the color filters, it is possible to improve reproduction precision of de-mosaic processing in a high frequency range.

Further, because in the portion other than the peripheral portion configuring the two adjacent sides of the basic array pattern, the ratio of the number of pixels of the second color is higher than the ratio of the number of pixels of the first color, it is possible to improve precision of color reproducibility of the second color, so that it is possible to provide high resolution image data by performing processing such as interpolation.

Further, because in the array of the color filters, the basic array pattern is repeatedly disposed in the horizontal direction and in the vertical direction, it is possible to perform processing according to the repeating pattern when performing demosaic processing in the subsequent stage, so that it is possible to simplify the subsequent processing compared to the case of the conventional random array.

Further, because the ratio of the number of pixels of the first color corresponding to the first filter is higher than each ratio of the number of pixels of each color of the second color corresponding to the second filter, it is possible to suppress aliasing, so that it is possible to realize favorable high frequency reproducibility.

It is preferable that ratios of respective colors of the second color are the same in the second filter disposed in the portion other than the peripheral portion configuring two sides of the basic array pattern.

According to the present aspect, because the ratios of the colors of the second color corresponding to the second filter are the same, it is possible to realize uniform color reproducibility in the second color.

It is preferable that the second color is comprised of two colors including a first constituting color and a second constituting color, the second filter corresponding to the first constituting color is disposed in parallel in one of diagonal directions in the portion other than the peripheral portion configuring the two sides of the basic array pattern, and the second filter corresponding to the second constituting color is arranged in parallel in the other of the diagonal directions in the portion other than the peripheral portion configuring the two sides of the basic array pattern.

According to the present aspect, because each of the first constituting color and the second constituting color which constitutes the second color is arranged in parallel in each direction which is diagonal to the first direction and the second direction, and thus each of the first constituting color and the second constituting color is scattered in the first direction and in the second direction, it is possible to improve color reproducibility in the first direction and in the second direction.

It is preferable that M is 3. According to the present aspect, it is possible to reduce the number of pixels supported by the basic array pattern, so that it is possible to reduce processing load upon image processing such as interpolation of image data obtained by color imaging element.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×N (where M is an integer of three or greater, and N is an even number of six or greater) pixels in the first direction and in the second direction, the basic array pattern is repeatedly disposed in the first direction and in the second direction, the basic array pattern includes two types of a first sub-array and a second sub-array, in each of the first sub-array and the second sub-array, the color filters are arranged in an array pattern corresponding to M×(N/2) pixels, and the color filters include a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of the number of pixels of each color of the second color corresponding to the second filter, and in each of the first sub-array and the second sub-array, the first filter is disposed in a peripheral portion configuring two adjacent sides among four sides of the array pattern corresponding to M×(N/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array and the second sub-array.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×N (where M is an integer of three or greater, and N is an even number of six or greater) pixels in the first direction and in the second direction, the basic array pattern is repeatedly disposed in the first direction and in the second direction, the basic array pattern includes two types of a first sub-array and a second sub-array, in each of the first sub-array and the second sub-array, the color filters are arranged in an array pattern corresponding to M×(N/2) pixels, and the color filters include a first filter corresponding to a first color of one or more colors whose peak of transmittance falls within a range of a wavelength between 480 nm and 570 nm, and a second filter corresponding to a second color of two or more colors whose peak of transmittance falls outside the range, a ratio of the number of all pixels of the first color corresponding to the first filter is higher than a ratio of the number of pixels of each color of the second color corresponding to the second filter, and in each of the first sub-array and the second sub-array, the first filter is disposed in a peripheral portion configuring two adjacent sides among four sides of the array pattern corresponding to M×(N/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array and the second sub-array.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×N (where M is an integer of three or greater, and N is an even number of six or greater) pixels in the first direction and in the second direction, the basic array pattern is repeatedly disposed in the first direction and in the second direction, the basic array pattern includes two types of a first sub-array and a second sub-array, in each of the first sub-array and the second sub-array, the color filters are arranged in an array pattern corresponding to M×(N/2) pixels, and the color filters include a first filter corresponding to a first color of one or more colors, and a second filter corresponding to a second color of two or more colors, transmittance of the second filter being lower than transmittance of the first filter within a range of a wavelength between 500 nm and 560 nm, a ratio of the number of all pixels of the first color corresponding to the first filter is higher than a ratio of the number of pixels of each color of the second color corresponding to the second filter, and in each of the first sub-array and the second sub-array, the first filter is disposed in a peripheral portion configuring two adjacent sides among four sides of the array pattern corresponding to M×(N/2) pixels and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array and the second sub-array.

Another aspect of the present invention is a single plate color imaging element in which color filters are disposed on a plurality of pixels comprised of photoelectric conversion elements arranged in a first direction and a second direction perpendicular to the first direction, an array of the color filters includes a basic array pattern in which the color filters are arranged in an array pattern corresponding to M×N (where M is an integer of three or greater, and N is an even number of six or greater) pixels in the first direction and in the second direction, the basic array pattern is repeatedly disposed in the first direction and in the second direction, the basic array pattern includes two types of a first sub-array and a second sub-array, in each of the first sub-array and the second sub-array, the color filters are arranged in an array pattern corresponding to M×(N/2) pixels, the color filters include a first filter corresponding to a first color of two or more colors including a color most contributing to a brightness signal among three primary colors and a fourth color which is different from the three primary colors, and a second filter corresponding to a second color of two or more colors other than the first color, a ratio of the number of all pixels of the first color corresponding to the first filter is higher than a ratio of the number of pixels of each color of the second color corresponding to the second filter, and in each of the first sub-array and the second sub-array, the first filter is disposed in a peripheral portion configuring two adjacent sides among four sides of the array pattern corresponding to M×(N/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array and the second sub-array.

Another aspect of the present invention is a single plate color imaging element in which color filters are disposed on a plurality of pixels comprised of photoelectric conversion elements arranged in a first direction and a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes two first sub-arrays and two second sub-arrays which are two types of sub-arrays, in each of the first sub-arrays and the second sub-arrays, the color filters are arranged in an array pattern corresponding to (M/2)×(M/2) pixels, the color filters include a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of each number of pixels of each color of the second color corresponding to the second filter, and in each of the first sub-arrays and the second sub-arrays, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-arrays and the second sub-arrays.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes two first sub-arrays and two second sub-arrays which are two types of sub-arrays, in each of the first sub-arrays and the second sub-arrays, the color filters are arranged in an array pattern corresponding to (M/2)×(M/2) pixels, the color filters include a first filter corresponding to a first color of one or more colors whose peak of transmittance falls within a range of a wavelength between 480 nm and 570 nm, and a second filter corresponding to a second color of two or more colors whose peak of transmittance falls outside the range, a ratio of the number of all pixels of the first color corresponding to the first filter is higher than a ratio of the number of pixels of each color of the second color corresponding to the second filter, and in each of the first sub-arrays and the second sub-arrays, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-arrays and the second sub-arrays.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes two first sub-arrays and two second sub-arrays which are two types of sub-arrays, in each of the first sub-arrays and the second sub-arrays, the color filters are arranged in an array pattern corresponding to (M/2)×(M/2) pixels, the color filters include a first filter corresponding to a first color of one or more colors, and a second filter corresponding to a second color of two or more colors, transmittance of the second filter being lower than transmittance of the first filter within a range of a wavelength between 500 nm and 560 nm, a ratio of the number of all pixels of the first color corresponding to the first filter is higher than a ratio of the number of pixels of each color of the second color corresponding to the second filter, and in each of the first sub-arrays and the second sub-arrays, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-arrays and the second sub-arrays.

Another aspect of the present invention is single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes two first sub-arrays and two second sub-arrays which are two types of sub-arrays, in each of the first sub-arrays and the second sub-arrays, the color filters are arranged in an array pattern corresponding to (M/2)×(M/2) pixels, the color filters include a first filter corresponding to a first color of two or more colors including a color most contributing to a brightness signal among three primary colors and a fourth color which is different from the three primary colors, and a second filter corresponding to a second color of two or more colors other than the first color, a ratio of the number of all pixels of each color of the first color corresponding to the first filter is higher than a ratio of the number of pixels of each color of the second color corresponding to the second filter, and in each of the first sub-arrays and the second sub-arrays, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-arrays and the second sub-arrays.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes four types of a first sub-array, a second sub-array, a third sub-array and a fourth sub-array, in each of the first sub-array, the second sub-array, the third sub-array and the fourth sub-array, the color filters are arranged in an array pattern corresponding to (M/2)×(M/2) pixels, the color filters include a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of each number of pixels of each color of the second color corresponding to the second filter, and in each of the first sub-array, the second sub-array, the third sub-array and the fourth sub-array, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array, the second sub-array, the third sub-array and the fourth sub-array.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes four types of a first sub-array, a second sub-array, a third sub-array and a fourth sub-array, in each of the first sub-array, the second sub-array, the third sub-array and the fourth sub-array, the color filters are arranged in an array pattern corresponding to (M/2)×(M/2) pixels, the color filters include a first filter corresponding to a first color of one or more colors whose peak of transmittance falls within a range of a wavelength between 480 nm and 570 nm, and a second filter corresponding to a second color of two or more colors whose peak of transmittance falls outside the range, a ratio of the number of all pixels of the first color corresponding to the first filter is higher than a ratio of the number of pixels of each color of the second color corresponding to the second filter, and in each of the first sub-array, the second sub-array, the third sub-array and the fourth sub-array, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array, the second sub-array, the third sub-array and the fourth sub-array.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes four types of a first sub-array, a second sub-array, a third sub-array and a fourth sub-array, in each of the first sub-array, the second sub-array, the third sub-array and the fourth sub-array, the color filters are arranged in an array pattern corresponding to (M/2)×(M/2) pixels, the color filters include a first filter corresponding to a first color of one or more colors, and a second filter corresponding to a second color of two or more colors, transmittance of the second filter being lower than transmittance of the first filter within a range of a wavelength between 500 nm and 560 nm, a ratio of the number of all pixels of the first color corresponding to the first filter is higher than a ratio of the number of pixels of each color of the second color corresponding to the second filter, and in each of the first sub-array, the second sub-array, the third sub-array and the fourth sub-array, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array, the second sub-array, the third sub-array and the fourth sub-array.

Another aspect of the present invention is a single plate color imaging element in which color filters are disposed on a plurality of pixels comprised of photoelectric conversion elements arranged in a first direction and in a second direction perpendicular to the first direction, an array of the color filters includes a basic array pattern in which the color filters are arranged in an array pattern corresponding to M×M (where M is an even number of six or greater) pixels in the first direction and in the second direction, the basic array pattern is repeatedly disposed in the first direction and in the second direction, the basic array pattern includes four types of a first sub-array, a second sub-array, a third sub-array and a fourth sub-array, in each of the first sub-array, the second sub-array, the third sub-array and the fourth sub-array, the color filters are arranged in an array pattern corresponding to (M/2)×(M/2) pixels, the color filters include a first filter corresponding to a first color of two or more colors including a color most contributing to a brightness signal among three primary colors and a fourth color which is different from the three primary colors, and a second filter corresponding to a second color of two or more colors other than the first color, a ratio of the number of all pixels of each color of the first color corresponding to the first filter is higher than a ratio of the number of pixels of each color of the second color corresponding to the second filter, and in each of the first sub-array, the second sub-array, the third sub-array and the fourth sub-array, the first filter is disposed in a peripheral portion configuring two adjacent sides among four sides of the array pattern corresponding to (M/2)×(M/2) pixels, and the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array, the second sub-array, the third sub-array and the fourth sub-array.

It is preferable that ratios of respective colors of the second color are the same in the second filter disposed in the portion other than the peripheral portion configuring two sides of each of the sub-arrays.

It is preferable that, in the portion other than the peripheral portion configuring the two sides of each of the sub-arrays, arrangement of the second filter corresponding to each color of the second color is different between the sub-arrays included in the basic array pattern.

According to the present aspect, the arrangement of the second filter is different between the sub-arrays, so that it is possible to arrange the second filter in various forms.

It is preferable that the second color is comprised of two colors including a first constituting color and a second constituting color, the second filter corresponding to the first constituting color is arranged in parallel in one of diagonal directions in the portion other than the peripheral portion configuring two sides of each of the first sub-array and the second sub-array, and the second filter corresponding to the second constituting color is arranged in parallel in the other of the diagonal directions in the portion other than the peripheral portion configuring the two sides of each of the first sub-array and the second sub-array.

It is preferable that the second filter corresponding to all the colors constituting the second color and the first filter are disposed on a diagonal filter line extending in a third direction and in a fourth direction which are tilted with respect to the first direction and the second direction in the color filters, the diagonal filter line corresponding to six or more pixels.

According to the present aspect, in the third direction and in the fourth direction, a filter line including each color of the second color filter as well as a filter line including the first color filter are arranged in proximity. Therefore, it is possible to improve high frequency reproducibility of image data in the third direction and in the fourth direction, so that it is possible to suppress color moire (false color) which may occur by an input image having high frequency components in the third and fourth directions. For example, when a filter corresponding to one pixel (unit pixel) has a side extending in the first direction and a side extending in the second direction, the diagonal directions of the filter corresponding to this unit pixel may correspond to the third direction and the fourth direction.

It is preferable that M is 6.

It is preferable that M is 3 and N is 6.

It is preferable that the contribution ratio of the first color to obtain the brightness signal is 50% or higher, and the contribution ratio of the second color to obtain the brightness signal is lower than 50%.

According to the present aspect, because the first filter having a higher contribution ratio to obtain a brightness signal than the second filter is disposed in one or more pixels within a line of each direction of the first direction to the fourth direction of the array of the color filters, it is possible to improve reproduction precision of de-mosaic processing in a high frequency range.

It is preferable that the first color includes at least one of green and transparence.

It is preferable that the second color includes red and blue.

An imaging device which achieves the object of the present invention includes an imaging optical system, a color imaging element at which a subject image is formed through the imaging optical system, and an image data generating unit that generates image data indicating the formed subject image, and the color imaging element is a color imaging element according to any of the above-described aspects.

Because, in the color imaging element of the present invention, the first filter is disposed within the line of each direction of the first direction to the fourth direction of the color filter array, and the ratio of the number of pixels of the first color corresponding to the first filter is made higher than the ratio of the number of pixels of the second color corresponding to the second filter, the second color including two or more colors other than the first color, it is possible to improve reproduction precision of de-mosaic processing in a high frequency range and suppress aliasing.

Further, because, in the portion other than the peripheral portion configuring the two adjacent sides of the basic array pattern or the sub-array, the ratio of the number of pixels of the second color is higher than the ratio of the number of pixels of the first color, it is possible to improve precision of color reproducibility of the second color, so that it is possible to provide high resolution image data by performing processing such as interpolation.

Further, because, in the color filter array, the basic array pattern is repeatedly disposed in the first direction and in the second direction, it is possible to perform processing according to the repeating pattern when performing de-mosaic processing in the subsequent stage, so that it is possible to simplify processing in the subsequent stage compared to the case of the conventional random array.

Further, because the imaging device of the present invention includes the above-described color imaging element of the present invention, it is possible to suppress occurrence of a false color and realize high resolution, and it is possible to simplify the processing in the subsequent stage compared to the case of the conventional random array.

BRIEF DESCRIPTION OF THE DRAWINGS

FIG. 6 is a front view of a color filter array of a second embodiment, (a) is a diagram showing one example of the basic array pattern, and (b) is a diagram showing the color filter array in which a plurality of the basic array patterns of (a) are disposed.

FIG. 7 is a front view of the color filter array of the second embodiment, (a) is a diagram showing another example of the basic array pattern, and (b) is a diagram showing the color filter array in which a plurality of the basic array patterns of (a) are disposed.

FIG. 8 is a front view showing a color filter array of a third embodiment, (a) is a diagram showing one example of the basic array pattern, and (b) is a diagram showing the color filter array in which a plurality of the basic array patterns of (a) are disposed.

FIG. 9 is a front view of a color filter array of a third embodiment, (a) is a diagram showing another example of the basic array pattern, and (b) is a diagram showing the color filter array in which a plurality of the basic array patterns of (a) are disposed.

FIG. 10 is a front view of a color filter array of a fourth embodiment, (a) is a diagram showing one example of the basic array pattern, and (b) is a diagram showing the color filter array in which a plurality of the basic array patterns of (a) are disposed.

FIG. 11 is a front view showing the color filter array of the fourth embodiment, (a) is a diagram showing another example of the basic array pattern, and (b) is a diagram showing the color filter array in which a plurality of the basic array patterns of (a) are disposed.

FIG. 12 is a front view showing a color filter array of a fifth embodiment, (a) is a diagram showing one example of the basic array pattern, and (b) is a diagram showing the color filter array in which a plurality of the basic array patterns of (a) are disposed.

FIG. 13 is a front view showing the color filter array of the fifth embodiment, (a) is a diagram showing another example of the basic array pattern, and (b) is a diagram showing the color filter array in which a plurality of the basic array patterns of (a) are disposed.

FIG. 14 is a front view showing a color filter array of a sixth embodiment, (a) is a diagram showing one example of the basic array pattern, and (b) is a diagram showing the color filter array in which a plurality of the basic array patterns of (a) are disposed.

FIG. 15 is a front view showing the color filter array of the sixth embodiment, (a) is a diagram showing another example of the basic array pattern, and (b) is a diagram showing the color filter array in which a plurality of the basic array patterns of (a) are disposed.

FIG. 16 is a front view showing one example of a color filter array of a seventh embodiment, (a) is a diagram showing one example of the basic array pattern, and (b) is a diagram showing another example of the basic array pattern.

FIG. 17 is a front view showing another example of the color filter array of the seventh embodiment, and (a) is a diagram showing one example of the basic array pattern, and (b) is a diagram showing another example of the basic array pattern.

FIG. 18 is a front view showing another example of a color filter array of an eighth embodiment, (a) is a diagram showing one example of the basic array pattern, and (b) is a diagram showing another example of the basic array pattern.

FIG. 19 is a front view showing another example of a color filter array of a ninth embodiment, (a) is a diagram showing one example of the basic array pattern, and (b) is a diagram showing another example of the basic array pattern.

DETAILED DESCRIPTION OF THE EMBODIMENTS

[Overall Configuration of Digital Camera]

Figure 1:
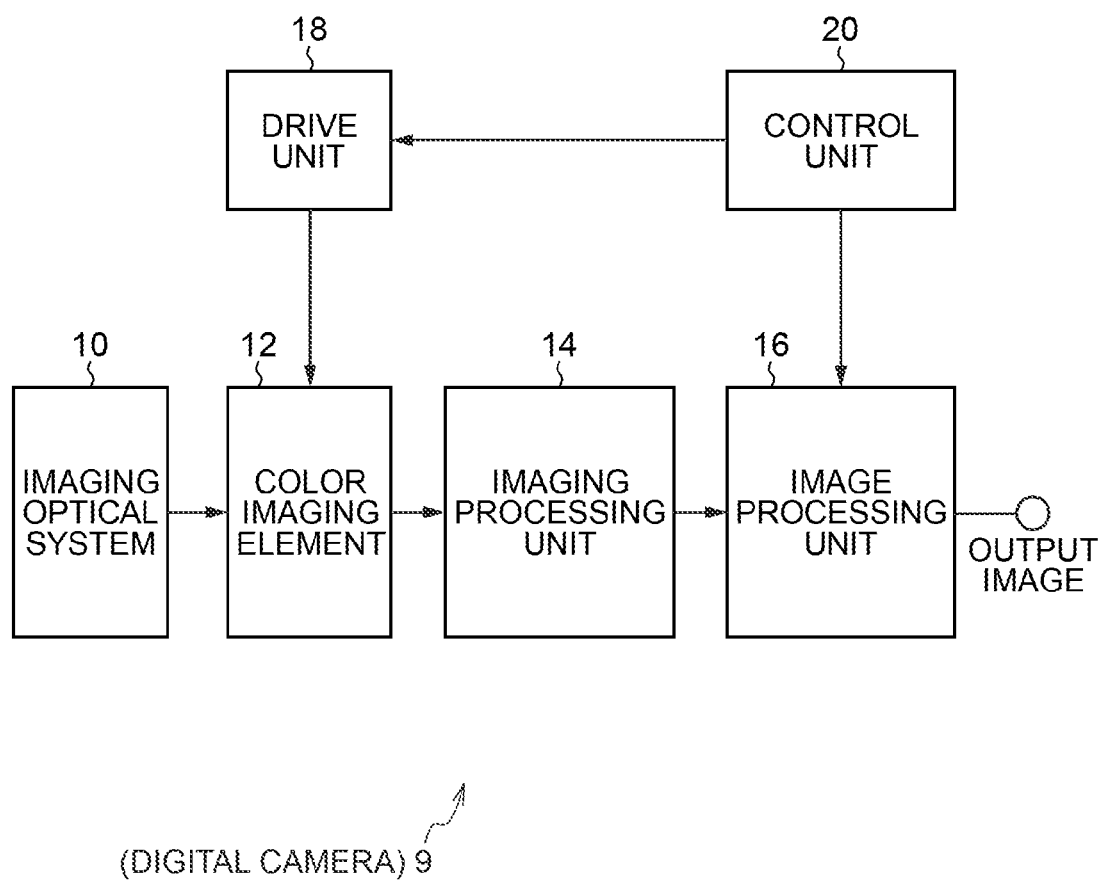
FIG. 1 is a block diagram showing an electrical configuration of a digital camera.

FIG. 1 is a block diagram of a digital camera 9 provided with a color imaging element according to the present invention. The digital camera 9 mainly includes an imaging optical system 10, a color imaging element 12, an imaging processing unit 14, an image processing unit 16, a drive unit 18, a control unit 20, and the like.

The imaging optical system 10 forms a subject image on an imaging face of the color imaging element 12. The color imaging element 12 is, so-called, a single plate color imaging element, and includes a plurality of pixels comprised of photoelectric conversion elements arranged in two dimensions on the imaging face, and color filters provided above the light receiving faces of the respective pixels. Here, "above" and "on" designate a direction at a side a subject light is incident on the imaging face of the color imaging element 12.

The subject image formed by the color imaging element 12 is converted into signal charges according to an amount of incident light by the photoelectric conversion element of each pixel. The signal charges accumulated at each photoelectric conversion element are sequentially retrieved from the color imaging element 12 as a voltage signal (image signal) according to the signal charges based on a drive pulse which is provided from the drive unit 18 according to an instruction from the control unit 20. The image signal retrieved from the color imaging element 12 is a signal indicating a mosaic image having colors corresponding to the color filter array of the color imaging element 12. It should be noted that the color imaging element 12 may be other types of imaging elements such as a CCD (Charge Coupled Device) imaging element and a CMOS (Complementary Metal Oxide Semiconductor) imaging element.

The image signal retrieved from the color imaging element 12 is input to the imaging processing unit 14. The imaging processing unit 14 has a correlated double sampling circuit (CDS) for removing a reset noise included in the image signal, an AGC circuit for amplifying the image signal to control the image signal to have a certain level of magnitude, and an A/D converter. The imaging processing unit 14 performs correlated double sampling processing on the input image signal and amplifies the image signal, and then, outputs RAW data obtained by converting the image signal into a digital image signal to the image processing unit 16. It should be noted that if the color imaging element 12 is a MOS imaging element, the A/D converter is often built into the imaging element, and the above-described correlated double sampling may not be required.

The image processing unit 16 has a white balance correction circuit, a gamma correction circuit, a de-mosaic processing circuit (processing circuit for calculating (and simultaneously converting) all the color information of RGB for each pixel from a mosaic image of RGB associated with the color filter array of the single plate color imaging element 12), a brightness/color difference signal generation circuit, a contour correction circuit, a color correction circuit, and the like. The image processing unit 16 performs desired signal processing on the RAW data of the mosaic image input from the imaging processing unit 14 according to an instruction from the control unit 20 to generate an RGB pixel signal having all the color information of RGB for each pixel, and generates image data (YUV data) comprised of brightness data (Y data) and color difference data (Cr, Cb data) based on the RGB pixel signal.

The image data generated at the image processing unit 16 is subjected to compression processing conforming to the JPEG standard if the image data is a still image, and subjected to compression processing conforming to the MPEG2 standard if the image data is a moving image, by a compression/expansion process circuit, and then, recorded in a recording medium (for example, a memory card) which is not shown, output to display device (not shown) such as a liquid crystal monitor, and displayed. It should be noted that, in the present embodiment, the recording medium is not limited to one which can be attached to and removed from the digital camera 9 and may be a built-in magnetooptical recording medium, and the display device is not limited to one provided at the digital camera 9 and may be an external display connected to the digital camera 9.

[Color Imaging Element]

Figure 2:
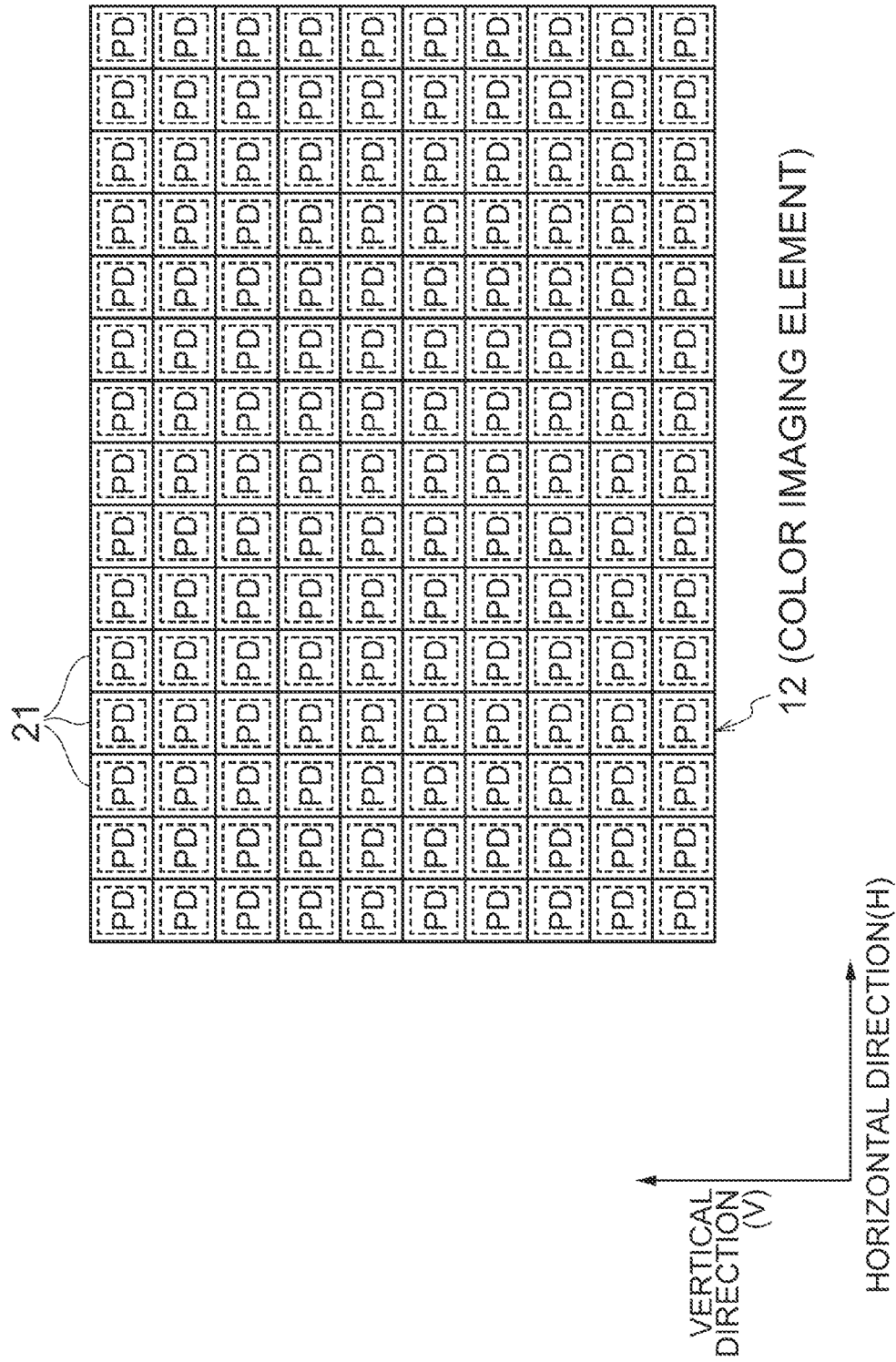
FIG. 2 is a front view of an imaging face of a color imaging element.

As shown in FIG. 2, a plurality of pixels 21 comprised of photoelectric conversion elements PD which are arranged in two dimensions in a horizontal direction and in a vertical direction are provided on the imaging face of the color imaging element 12. Here, the horizontal direction corresponds to one direction of a first direction and a second direction of the present invention, and the vertical direction corresponds to the other direction of the first direction and the second direction of the present invention.

Figure 3:
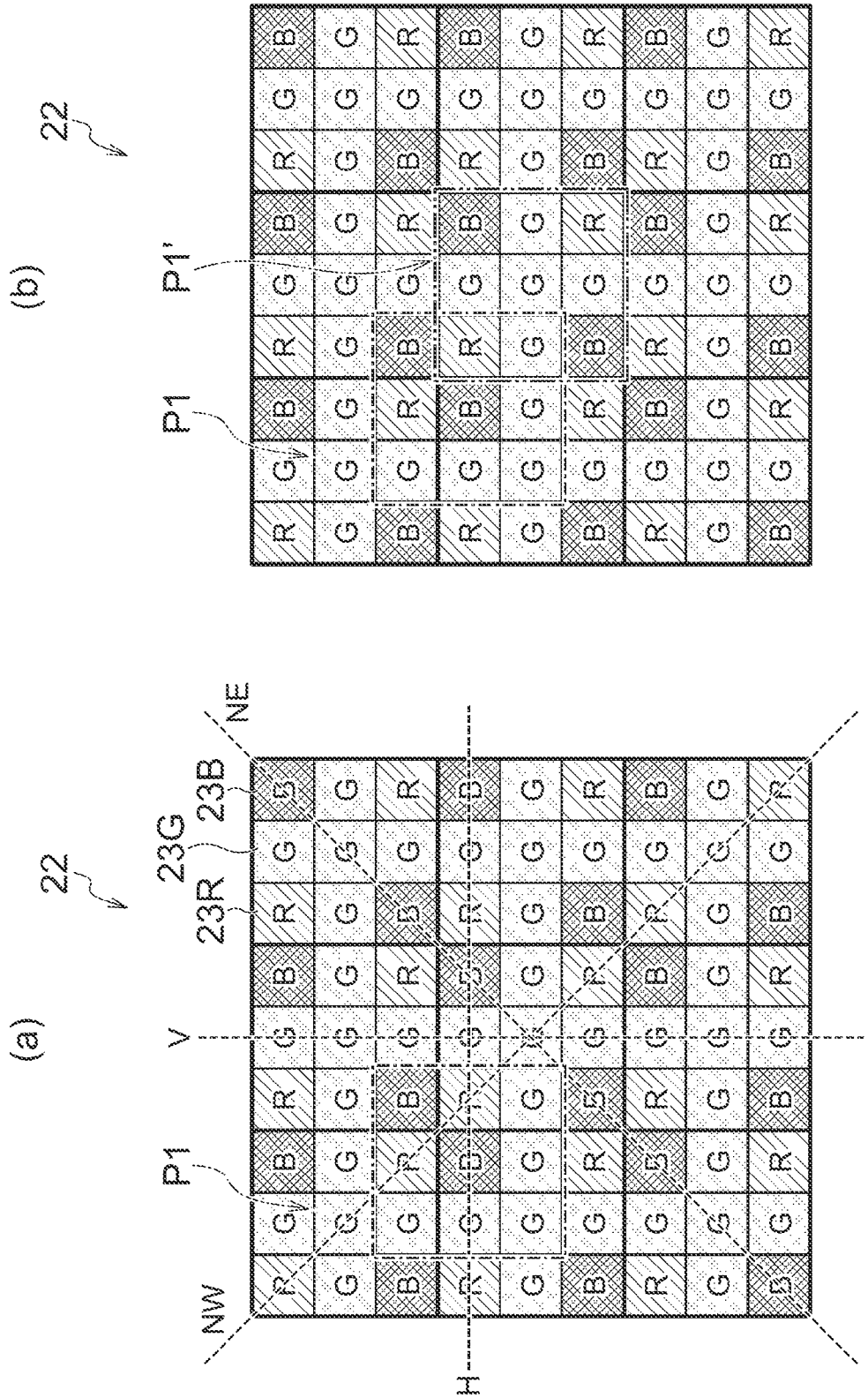
FIG. 3 is a front view of a color filter array of a first embodiment, (a) is a diagram for explaining arrangement characteristics of the color filter array, and (b) is a diagram for explaining that there are a plurality of basic array patterns.

On the imaging face of the color imaging element 12, a color filter array 22 comprised of color filters disposed on the respective pixels 21 are provided (see FIG. 3(a)). The color filter array 22 is comprised of color filters 23R, 23G and 23B of three primary colors of red (R), green (G) and blue (B) (hereinafter, referred to as an R filter, a G filter and a B filter). On each of the pixels 21, one of the RGB filters 23R, the 23G and the 23B is disposed. Hereinafter, a pixel on which the R filter 23R is disposed is referred to as an "R pixel", a pixel on which the G filter 23G is disposed is referred to as a "G pixel", and a pixel on which the B filter 23B is disposed is referred to as a "B pixel".

Here, the G color corresponds to the first color of the present invention, and the G filter 23G corresponds to a first filter of the present invention. Further, the color R and the color B correspond to a second color of the present invention, and the RB filters 23R and 23B correspond to a second filter of the present invention.

First Embodiment

The color filter array 22 according to the present embodiment has the following characteristics.

[Characteristics (1)]

Figure 4:
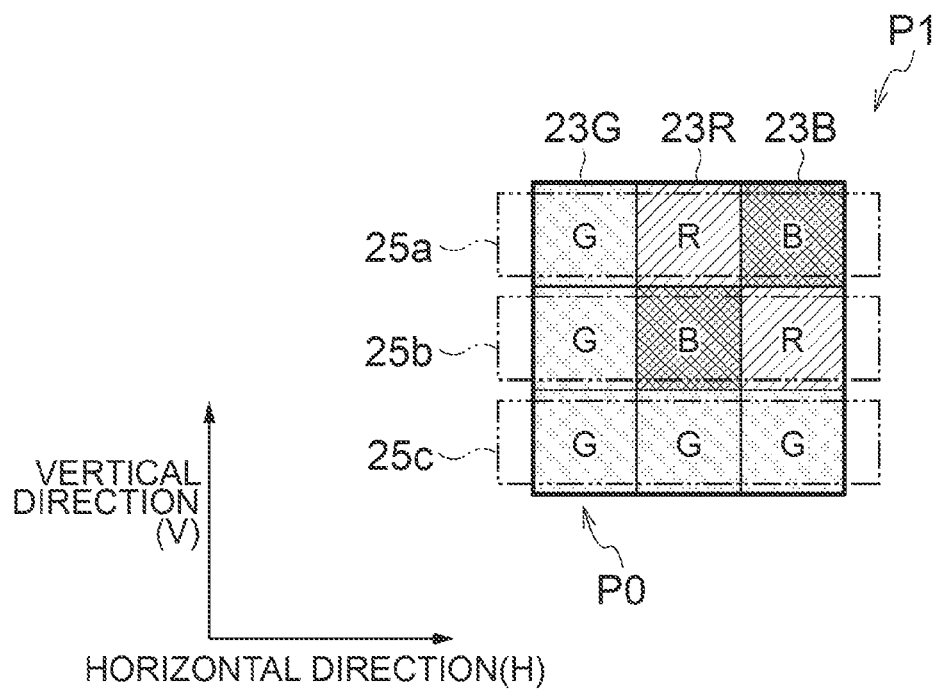
FIG. 4 is an enlarged view of one example of the basic array pattern in FIG. 3.

As shown in FIG. 3(a) and FIG. 4, the color filter array 22 includes a basic array pattern P1 which is a square array pattern corresponding to 3×3 pixels (M×M pixels) in the horizontal direction and in the vertical direction, and the basic array pattern P1 is repeatedly disposed in the horizontal direction and in the vertical direction. Therefore, in the color filter array 22, R filters 23R, G filters 23G and B filters 23B of respective colors are periodically arranged.

Therefore, when de-mosaic processing, or the like, is performed on the R, G, B signals retrieved from the color imaging element 12, the processing can be performed according to the repeating pattern. As a result, it is possible to simplify the processing in the subsequent stage compared to the case of the conventional random array. Further, when thinning processing is performed in units of the basic array pattern P1 to reduce the size of the image, the color filter array after the thinning processing can be made the same as the color filter array prior to the thinning processing, so that it is possible to use a common processing circuit.

[Characteristics (2)]

In the basic array pattern P1, three types of filter arrays (a first filter array 25a, a second filter array 25b and a third filter array 25c) extending in parallel in the horizontal direction are sequentially arranged in the vertical direction (see FIG. 4). The first filter array 25a is a "filter array in which a G filter 23G, an R filter 23R and a B filter 23B are arranged in parallel in the horizontal direction", the second filter array 25b is a "filter array in which a G filter 23G, a B filter 23B and an R filter 23R are arranged in parallel in the horizontal direction", and the third filter array 25c is a "filter array in which a G filter 23G, a G filter 23G and a G filter 23G are arranged in parallel in the horizontal direction".

Therefore, in the basic array pattern P1 of this example, (five pixels of) G filters 23G are disposed in a peripheral portion Po configuring two adjacent sides among four sides of the array pattern corresponding to 3×3 pixels.

Further, in the region corresponding to 2×2 pixels other than the peripheral portion Po, two pixels of R filters 23R and two pixels of B filters 23B are disposed, so that ratios of the respective color R and color B (the second color) are the same. In this example, the R filters 23R corresponding to the R color are arranged in parallel in one of the diagonal directions in the portion other than the peripheral portion Po configuring the two sides of the basic array pattern P1, B filters 23B corresponding to the color B are arranged in parallel in the other of the diagonal directions in the portion other than the peripheral portion Po. Particularly, in this example, the B filters 23B are disposed on the diagonal line which passes the G filter 23G (the G filter 23G which forms a corner portion among the G filters 23G disposed in an L shape) corresponding to the pixel common between the two sides configured by the peripheral portion Po of the basic array pattern P1. Therefore, in the portion other than the peripheral portion Po, the RB filters 23R and 23B are disposed such that the ratio of the number of pixels of the color R and the color B (the second color) is higher than the ratio of the number of pixels of the color G (the first color).

In the color filter array 22 in which a plurality of the basic array patterns P1 are disposed in parallel (see FIG. 3), the G filters 23G are disposed in each pixel line (filter line) of the horizontal direction (H), the vertical direction (V) and the diagonal directions (NE and NW). Here, NE, which indicates a lower-left to-upper-right diagonal direction, corresponds to one direction of a third direction and a fourth direction of the present invention. Further, NW, which indicates an upper-left-to-lower-right diagonal direction, corresponds to the other direction of the third direction and the fourth direction of the present invention. Because the RGB filters 23R, 23G and 23B have a square shape, the NE direction and the NW direction are directions respectively tilted by 45° with respect to the horizontal direction and the vertical direction. It should be noted that this angle may increase or decrease according to increase or decrease of the length of each side of the RGB filters 23R, 23G and 23B in the horizontal direction and in the vertical direction. For example, if color filters in a rectangular shape other than a square are used, the diagonal directions become diagonal (NE and NW directions). It should be noted that even if a color filter has a rectangular shape other than a square shape, if the color filters or pixels are disposed in a shape of a square lattice, the NE direction and the NW direction become directions respectively tilted by 45° with respect to the horizontal direction and the vertical direction.

A contribution ratio to obtain a brightness (Y) signal (the above-described brightness data) of the color G is higher than those of the color R and the color B. That is, the contribution ratios of the color R and the color B are lower than that of the color G. To be specific, the above-described image processing unit 16 generates a Y signal from the RGB pixel signal having all the color information of RGB for each pixel according to the following equation (1). The following equation (1) is an equation generally used for generating a Y signal at the color imaging element 12. In this equation (1), because the contribution ratio of the color G to the brightness signal is 60%, the contribution ratio of the color G becomes higher than those of the color R (whose contribution ratio is 30%) and the color B (whose contribution ratio is 10%). Therefore, the color G contributes most to the brightness signal among the three primary colors.

$$Y=0.3R+0.6G+0.1B \qquad \text{Equation (1)}$$

Because such G filters 23G are disposed in each pixel line of the horizontal direction (H), the vertical direction (V) and the diagonal directions (NE and NW) of the color filter array 22, it is possible to improve reproduction precision of de-mosaic processing in a high frequency range regardless of a direction of a high frequency in the input image. Particularly, the color filter array 22 has an array in which the R filters 23R and the B filters 23B are surrounded in the horizontal direction and in the vertical direction by the G filters 23G disposed in the peripheral portion Po of the basic array pattern P1, so that it is possible to discern a direction with high accuracy at a portion where a pixel line of the G filters 23G extending in the horizontal direction intersects with a pixel line of the G filters 23G extending in the vertical direction. That is, by obtaining a difference absolute value of pixel values of the pixels G in the horizontal direction and a difference absolute value of pixel values of the pixels G in the vertical direction in an intersecting portion which forms a cross array, it is possible to judge that there is correlation in a direction where the difference absolute value is smaller between the horizontal direction and the vertical direction. Further, by obtaining a difference absolute value of pixel values of the pixels G in the diagonal directions (NE and NW) in an intersecting portion, it is possible to judge that there is correlation in a direction where the difference absolute value is smaller among each diagonal direction. As a result, in the color filter array 22, it is possible to discern a direction with higher correlation among the horizontal direction, the vertical direction and the diagonal directions using the information of the pixel G with minimal pixel spacing (the pixel spacing described here refers to pixel spacing (pitch) from a center point of a reference pixel to a center point of an adjacent pixel). The result of the discerned direction can be used in processing (de-mosaic processing) for performing interpolation from peripheral pixels. It should be noted that, it is preferable that, in this case, for example, a direction discerning processing unit is provided inside the above-described de-mosaic processing circuit so that the direction discerning processing unit discerns a direction.

It should be noted that in order to reduce occurrence of color moire (false color), R filters 23R and B filters 23B are preferably disposed within each line of the horizontal direction (H) and the vertical direction (V) of the color filter array 22 in the basic array pattern P1. However, it is possible to obtain the R and B pixel values in the pixels G in the third filter array 25c by performing interpolation processing from the pixels corresponding to the R filters 23R and the B filters 23B in the adjacent first filter array 25a and the adjacent second filter array 25b using such as the result of the direction discerned using an output signal value from the above-described adjacent G pixel group.

[Characteristics (3)]

The numbers of pixels of pixels R, pixels G and pixels B corresponding to the RGB filters 23R, 23G and 23B in the basic array pattern P1 are, respectively, two pixels, five pixels and two pixels. Therefore, because the ratio of the numbers of the pixels of the RGB pixels is 2:5:2, the ratio of the number of pixels of the pixels G which most contribute to obtain the brightness signal is higher than the respective ratios of the numbers of pixels of the pixels R and the pixels B.

In this way, because the ratio of the number of pixels of the pixels G is different from the respective ratios of the numbers of pixels of the pixels R and the pixels B, and, particularly, the ratio of the number of pixels of the pixels G which most contribute to obtain the brightness signal is made higher than the respective ratios of the numbers of pixels of the pixels R and the pixels B, it is possible to suppress aliasing upon de-mosaic processing, thereby realizing favorable high frequency reproducibility.

[Characteristics (4)]

The G filters 23G or the B filters 23B are disposed so as to adjacent to the R filters 23R in this example in each direction of the horizontal (H) and the vertical (V) directions. Further, the G filters 23G or the R filters 23R are disposed so as to be adjacent to the B filters 23B in this example in each direction of the horizontal (H) and the vertical (V) directions. Therefore, different color filters are disposed so as to be adjacent to the RB filters 23R and 23B in each direction of the horizontal (H) and the vertical (V) directions. That is, the R filters 23R and the B filters 23B are not disposed such that the same color filters are adjacent to each other in each direction of the horizontal (H) and the vertical (V) directions.

By this means, in the color filter array 22 shown in FIG. 3(a), the ratio of a pixel line in which the R filters 23R and the G filters 23G are arranged and a pixel line in which the B filters 23B and the G filters 23G are arranged is 1:2 in the NW direction. Further, in the color filter array 22 shown in FIG. 3(a), the ratio of a pixel line in which the R filters 23R and the G filters 23G are arranged and a pixel line in which the B filters 23B and the G filters 23G are arranged is 2:1 in the NE direction.

That is, in the NW direction, each pixel line including B filters 23B is disposed adjacent to another pixel line including B filters 23B of the same color, and each pixel line including R filters 23R is disposed three pixels adjacent to another pixel line including R filters 23R of the same color. Meanwhile, in the NE direction, each pixel line including R filters 23R is disposed adjacent to another pixel line including R filters 23R of the same color, and each pixel line including B filters 23B is disposed three pixels adjacent to another pixel line including B filters 23B of the same color. Here, a state where pixel lines are adjacent to each other in the diagonal directions means a state where pixel spacing between the pixel lines is $\sqrt{2}/2$ when a square filter whose length of one side is 1 is used.

If the RB filters 23R and 23B having such arrangement characteristics are disposed in the color filter array 22, it is possible to perform de-mosaic processing of the pixels R and the pixels B with high accuracy.

Because the RB filters 23R and 23B are respectively disposed in close pixel lines extending in the diagonal directions (NE and NW), it is possible to effectively suppress color moire (false color) which may occur by an input image having a high frequency component in the diagonal directions (NE and NW).

That is, if there is distant space between the R filters 23R and between the B filters 23B between the pixels lines in the diagonal directions, interpolation processing is difficult, and color moire (false color) is likely to occur, which makes it difficult to remove an optical low-pass filter. Further, if the number of pixels of the R filters 23R and the B filters 23B is small, because color reproducibility is not favorable, it is preferable that more R filters 23R and B filters 23B are disposed.

Therefore, if the color filter according to the present embodiment is used, even if an optical low-pass filter having anisotropy in the diagonal (NE and NW) directions is not disposed between the imaging optical system 10 and the imaging face, it is possible to suppress color moire (false color) which may occur by the input image having a high frequency component in the diagonal directions, and, even when an optical low-pass filter is applied, it is possible to suppress specific color moire (false color) by the optical low-pass filter which poorly functions in cutting a high frequency component. As a result, it is possible to prevent degradation of resolution in the diagonal directions.

It should be noted that even if there is some space between the R filters 23R and between B filters 23B on the pixel lines in the diagonal directions, because it is possible to appropriately discern a direction for interpolation based on output signals of the pixels corresponding to the (L-shaped) G filters 23G disposed in the horizontal direction and in the vertical direction, there is relatively small influence on interpolation accuracy, caused by a situation where there is distant space between the R filters 23R and between the B filters 23B on the pixel lines in the diagonal directions.

Figure 5:
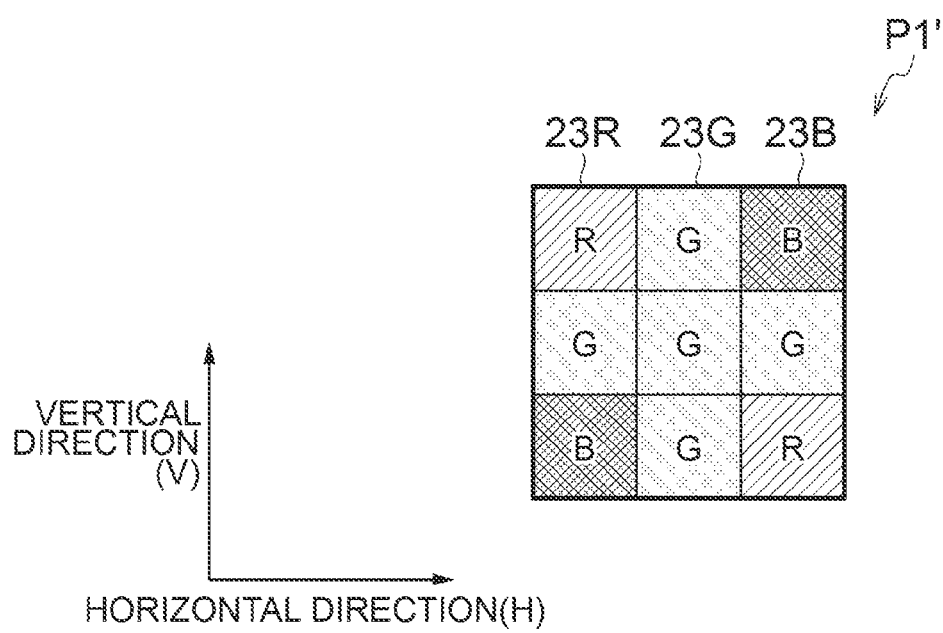
FIG. 5 is an enlarged view of another example of the basic array pattern in FIG. 3.

There are a plurality of basic array patterns which can configure the color filter array 22 shown in FIG. 3(a), other than the basic array pattern P1 shown in FIG. 4. That is, it is also possible to use the array pattern corresponding to 3×3 pixels obtained by shifting the basic array pattern shown in FIG. 4 in the horizontal direction and/or in the vertical direction as the basic array pattern, and, even if, for example, an array pattern P1' shown in FIG. 3(b) and FIG. 5 is used as the basic array pattern, it is possible to configure color filters having an array equivalent to the color filter array 22 shown in FIG. 3(a).

As described above, because the color filter array 22 according to the present embodiment has the above-described characteristics, it is possible to simplify the de-mosaic processing in the subsequent stage, improve reproduction precision of the de-mosaic processing in a high frequency range, suppress aliasing and improve high frequency reproducibility upon de-mosaic processing, improve accuracy of the de-mosaic processing performed on pixels R and pixels B, and realize higher resolution. Further, the color filter array 22 according to the present embodiment has a ratio of G, R and B pixels close to the ratio in the Bayer array, and thus excels in color reproducibility.

Second Embodiment

Figure 6:
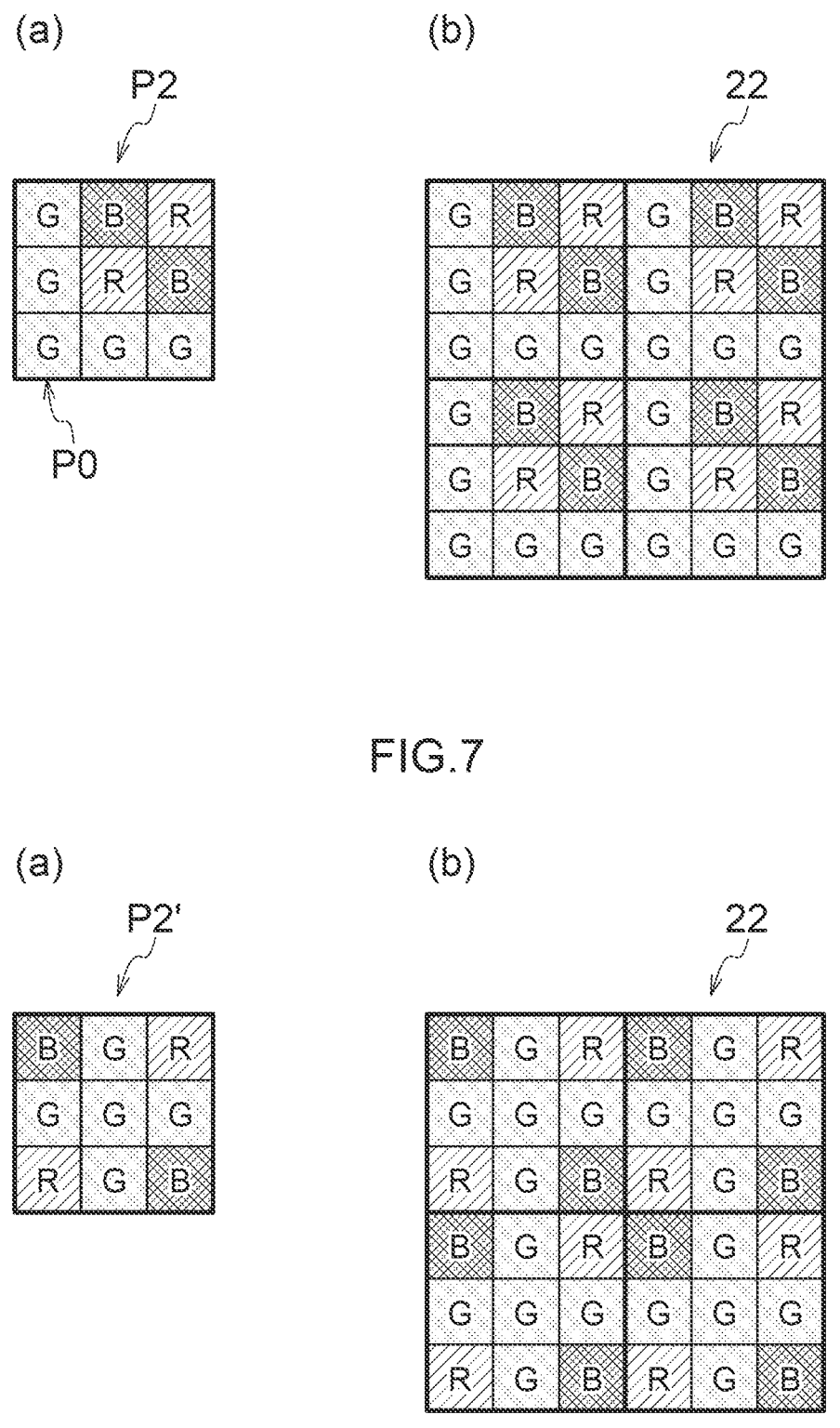

FIG. 6 is a diagram showing a basic array pattern of color filters according to the second embodiment, and (a) shows one basic array pattern P2, and (b) shows a state where total of four basic array patterns P2 are disposed, two in the horizontal direction and two in the vertical direction.

In the present embodiment, the explanation of the features which are the same as or similar to those in the above-described first embodiment will be omitted.

[Characteristics (1)]

As shown in FIG. 6, the color filter array 22 according to the present embodiment also includes a basic array pattern P2 which is a square array pattern corresponding to 3×3 pixels in the horizontal direction and in the vertical direction, and this basic array pattern P2 is repeatedly disposed in the horizontal direction and in the vertical direction. Therefore, R filters 23R, G filters 23G and B filters 23B of each color are also periodically arranged, which enables de-mosaic processing, or the like, of R, G and B signals according to the repeating pattern and enables use of a common processing circuit before and after thinning processing when the size of an image is reduced by performing thinning processing in units of the basic array pattern P2.

[Characteristics (2)]

Also in the basic array pattern P2 of the present embodiment, three types of filter arrays extending in parallel in the horizontal direction are sequentially arranged in the vertical direction, and "a filter array (first filter array) in which a G filter 23G, a B filter 23B and an R filter 23R are disposed in parallel in the horizontal direction", "a filter array (second filter array) in which a G filter 23G, an R filter 23R and a B filter 23B are disposed in parallel in the horizontal direction" and "a filter array (third filter array) in which a G filter 23G, a G filter 23G and a G filter 23G are disposed in parallel in the horizontal direction" are sequentially arranged in the vertical direction.

Therefore, also in the basic array pattern P2 in this example, G filters 23G are disposed in a peripheral portion Po which configures two adjacent sides among four sides of the array pattern corresponding to 3×3 pixels. Further, in the region corresponding to 2×2 pixels other than the peripheral portion Po, two pixels of R filters 23R and two pixels of B filters 23B are disposed, and R filters 23R are disposed in parallel in one of the diagonal directions in the portion other than the peripheral portion Po which configures two sides of the basic array pattern P2, and B filters 23B are disposed in parallel in the other of the diagonal directions.

However, in this example, R filters 23R are disposed on the diagonal which passes the G filter 23G (the G filter 23G which forms a corner portion among G filters 23G disposed in an L shape) corresponding to a pixel common between two sides configured by the peripheral portion Po of the basic array pattern P2. Therefore, the R filters 23R and the B filters 23B are inversely disposed between the color filter according to the first embodiment (basic array pattern P1) and the color filter according to the second embodiment (basic array pattern P2).

In the color filter array 22 configured by disposing a plurality of basic array patterns P2 in parallel, G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P2 are two pixels, five pixels and two pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

Also in this example, filters of different colors are disposed adjacent to the RB filters 23R and 23B in each direction of the horizontal (H) and the vertical (V) directions, and R filters 23R of the same color or the B filters 23B of the same color are not disposed adjacent to each other in each direction of the horizontal (H) and the vertical (H) directions.

By this means, in the NE direction, each pixel line including B filters 23B is disposed at positions (one pixel) adjacent to another pixel line including B filters 23B of the same color, and each pixel line including R filters 23R is disposed at positions three pixels adjacent to another pixel line including R filters 23R of the same color. Meanwhile, in the NW direction, each pixel line including R filters 23R is disposed at positions (one pixel) adjacent to another pixel line including R filters 23R of the same color, and each pixel line including B filters 23B is disposed at positions three pixels adjacent to another pixel line including B filters 23B of the same color. In this way, because the RB filters 23R and 23B are respectively disposed in close pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

It should be noted that there are a plurality of basic array patterns which can configure the color filter array 22 shown in FIG. 6(b), other than the basic array pattern shown in FIG. 6(a), and the array pattern corresponding to 3×3 pixels obtained by shifting the basic array pattern shown in FIG. 4 in the horizontal direction and/or in the vertical direction can be used as the basic array pattern. For example, it is also possible to configure the color filter array equivalent to the color filter array 22 shown in FIG. 6(b) using the array pattern P2' shown in FIG. 7(a) as the basic array pattern (see FIG. 7(b)).

As described above, the color filters according to the present embodiment have characteristics and advantages which are the same as those of the color filters according to the above-described first embodiment.

Third Embodiment

FIG. 8 is a diagram showing a basic array pattern of color filters according to the third embodiment, and (a) shows one basic array pattern P3, and (b) shows a state where total of four basic array patterns P3 are disposed, two in the horizontal direction and two in the vertical direction.

In the present embodiment, the explanation of the features which are the same as or similar to those in the above-described first embodiment will be omitted.

[Characteristics (1)]

As shown in FIG. 8, the color filter array 22 according to the present embodiment also includes a basic array pattern P3 which is a square array pattern corresponding to 3×3 pixels in the horizontal direction and in the vertical direction, and this basic array pattern P3 is repeatedly disposed in the horizontal direction and in the vertical direction. Therefore, R filters 23R, G filters 23G and B filters 23B of each color are also periodically arranged, which enables de-mosaic processing, or the like, of R, G and B signals according to the repeating pattern and enables use of a common processing circuit before and after thinning processing when the size of an image is reduced by performing thinning processing in units of the basic array pattern P3.

[Characteristics (2)]

Also in the basic array pattern P3 of the present embodiment, three types of filter arrays extending in parallel in the horizontal direction are sequentially arranged in the vertical direction, and "a filter array (first filter array) in which a G filter 23G, a B filter 23B and a B filter 23B are disposed in parallel in the horizontal direction", "a filter array (second filter array) in which a G filter 23G, an R filter 23R and an R filter 23R are disposed in parallel in the horizontal direction" and "a filter array (third filter array) in which a G filter 23G, a G filter 23G and a G filter 23G are disposed in parallel in the horizontal direction" are sequentially arranged in the vertical direction.

Therefore, also in the basic array pattern P3 in this example, G filters 23G are disposed in a peripheral portion Po which configures two adjacent sides among four sides of the array pattern corresponding to 3×3 pixels. Further, in the region corresponding to 2×2 pixels other than the peripheral portion Po, two pixels of R filters 23R and two pixels of B filters 23B are disposed.

However, in the present embodiment, in the region corresponding to 2×2 pixels other than the peripheral portion Po, R filters 23R are disposed in parallel in the horizontal direction, and B filters 23B are disposed in parallel in the horizontal direction. Particularly, in this example, the R filters 23R are disposed in parallel at positions adjacent to the G filters 23G which are disposed in parallel in the horizontal direction in the peripheral portion Po of the basic array pattern P3, and the R filter 23R and the B filter 23B are disposed in parallel at positions adjacent to the G filters 23G which are disposed in parallel in the vertical direction in the peripheral portion Po of the basic array pattern P3.

In the color filter array 22 configured by disposing a plurality of basic array patterns P3 in parallel, the G filters 23G are disposed within each pixel line of the horizontal direction (H), the vertical direction (V) and the diagonal direction (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P3 are two pixels, five pixels and two pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

In the color filters including a plurality of basic array patterns P3 as described above, in the NW direction and in the NE direction, a "pixel line comprised of B filters 23B and G filters 23G" and a "pixel line comprised of R filters 23R and G filters 23G" extend across a "pixel line comprised of R filters 23R, G filters 23G and B filters 23B", and these pixel lines exist at a ratio of 1:1:1. Therefore, each pixel line including B filters 23B is disposed at a position on one side (one pixel) adjacent to another pixel line including B filters 23B of the same color, and each pixel line including R filters 23R is disposed at a position on one side (one pixel) adjacent to another pixel line including R filters 23R of the same color. In this way, because RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

It should be noted that there are a plurality of basic array patterns which can configure the color filter array 22 shown in FIG. 8(b), other than the basic array pattern P3 shown in FIG. 8(a), and it is also possible to use the array pattern corresponding to 3×3 pixels obtained by shifting the basic array pattern P3 shown in FIG. 8(a) in the horizontal direction and/or in the vertical direction as the basic array pattern, and it is possible to configure color filters having an array equivalent to the color filter array 22 shown in FIG. 8(b), for example, using an array pattern P3' shown in FIG. 9(a) as the basic array pattern (see FIG. 9(b)).

As described above, the color filters according to the present embodiment have characteristics and advantages which are the same as those of the color filters according to the above-described first embodiment. Particularly, because the color filters according to the present embodiment excel in proximity between the R filters 23R and proximity associated with the B filters 23B in the diagonal directions (NE and NW), it is possible to obtain data of a sharper image with higher resolution by preventing color moire (false color), or the like.

Embodiment 4

Figures 10, 11:
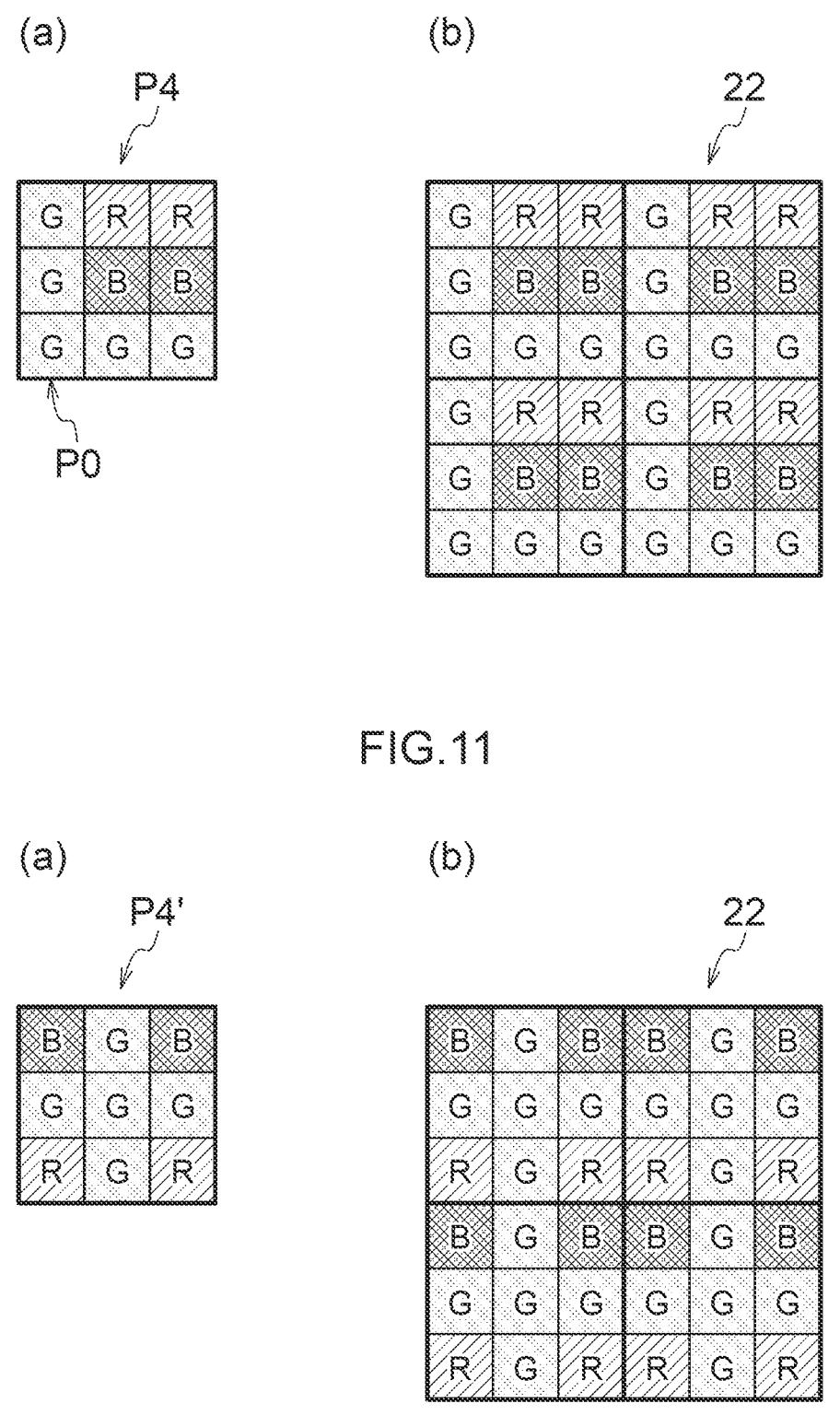

FIG. 10 is a diagram showing a basic array pattern of color filters according to the fourth embodiment, and (a) shows one basic array pattern P4, and (b) shows a state where total of four basic array patterns P4 are disposed, two in the horizontal direction and two in the vertical direction.

In the present embodiment, the explanation of the features which are the same as or similar to those in the above-described third embodiment will be omitted.

[Characteristics (1)]

As shown in FIG. 10, the color filter array 22 according to the present embodiment also includes a basic array pattern P4 which is a square array pattern corresponding to 3×3 pixels in the horizontal direction and in the vertical direction, and this basic array pattern P4 is repeatedly disposed in the horizontal direction and in the vertical direction. Therefore, R filters 23R, G filters 23G and B filters 23B of each color are also periodically arranged, which enables de-mosaic processing, or the like, of R, G and B signals according to the repeating pattern and makes it possible to share a processing circuit before and after thinning processing when the size of an image is reduced by performing thinning processing in units of the basic array pattern P4.

[Characteristics (2)]

Also in the basic array pattern P4 of the present embodiment, three types of filter arrays extending in parallel in the horizontal direction are sequentially arranged in the vertical direction, and "a filter array (first filter array) in which a G filter 23G, an R filter 23R and an R filter 23R are disposed in parallel in the horizontal direction", "a filter array (second filter array) in which a G filter 23G, a B filter 23B and a B filter 23B are disposed in parallel in the horizontal direction" and "a filter array (third filter array) in which a G filter 23G, a G filter 23G and a G filter 23G are disposed in parallel in the horizontal direction" are sequentially arranged in the vertical direction.

Therefore, also in the basic array pattern P4 in this example, G filters 23G are disposed in a peripheral portion Po which configures two adjacent sides among four sides of the array pattern corresponding to 3×3 pixels. Further, in the region corresponding to 2×2 pixels other than the peripheral portion Po, two pixels of R filters 23R and two pixels of B filters 23B are disposed. Further, in the region corresponding to 2×2 pixels other than the peripheral portion Po, the R filters 23R are disposed in parallel in the horizontal direction, the B filters 23B are disposed in parallel in the horizontal direction, and the R filters 23R and the B filters 23B are disposed at positions adjacent to the G filters 23G disposed in parallel in the vertical direction in the peripheral portion Po of the basic array pattern P4.

However, in this example, the B filters 23B are disposed in parallel at positions adjacent to the G filters 23G disposed in parallel in the horizontal direction in the peripheral portion Po of the basic array pattern P4. Therefore, the R filters 23R and the B filters 23B are inversely disposed between the color filters according to the third embodiment (basic array pattern P3) and the color filters according to the fourth embodiment (basic array pattern P4).

In the color filter array 22 configured by disposing a plurality of the basic array patterns P4 in parallel, the G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.
[Characteristics (3)]

Because the number of pixels of pixels R, pixels G and pixels B corresponding to the RGB filters 23R, 23G and 23B within the basic array pattern P4 are two pixels, five pixels and two pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.
[Characteristics (4)]

Also in the color filters including a plurality of basic array patterns P4 as described above, in the NW direction and in the NE direction, a "pixel line comprised of B filters 23B and G filters 23G" and a "pixel line comprised of R filters 23R and G filters 23G" extend across a "pixel line comprised of R filters 23R, G filters 23G and B filters 23B". Therefore, each pixel line including B filters 23B is disposed at a position on one side (one pixel) adjacent to another pixel line including B filters 23B of the same color, and each pixel line including R filters 23R is disposed at a position on one side (one pixel) adjacent to another pixel line including R filters 23R of the same color. In this way, because the RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

It should be noted that there are a plurality of basic array patterns which can configure the color filter array 22 shown in FIG. 10(b), other than the basic array pattern P4 shown in FIG. 10(a), and it is also possible to use the array pattern corresponding to 3×3 pixels obtained by shifting the basic array pattern P4 shown in FIG. 10(a) in the horizontal direction and/or in the vertical direction as the basic array pattern, and it is possible to configure color filters having an array equivalent to the color filter array 22 shown in FIG. 10(b), for example, using an array pattern P4' shown in FIG. 11(a) as the basic array pattern (see FIG. 11(b)).

As described above, the color filters according to the present embodiment have characteristics and advantages which are the same as those of the color filters according to the above-described third embodiment. Particularly, because the color filters according to the present embodiment excel in proximity between the R filters 23R and proximity associated with the B filters 23B in the diagonal directions (NE and NW) as with the color filters according to the third embodiment, it is possible to obtain data of a sharp image with higher resolution by preventing color moire (false color), or the like.

Fifth Embodiment

Figures 12, 13:
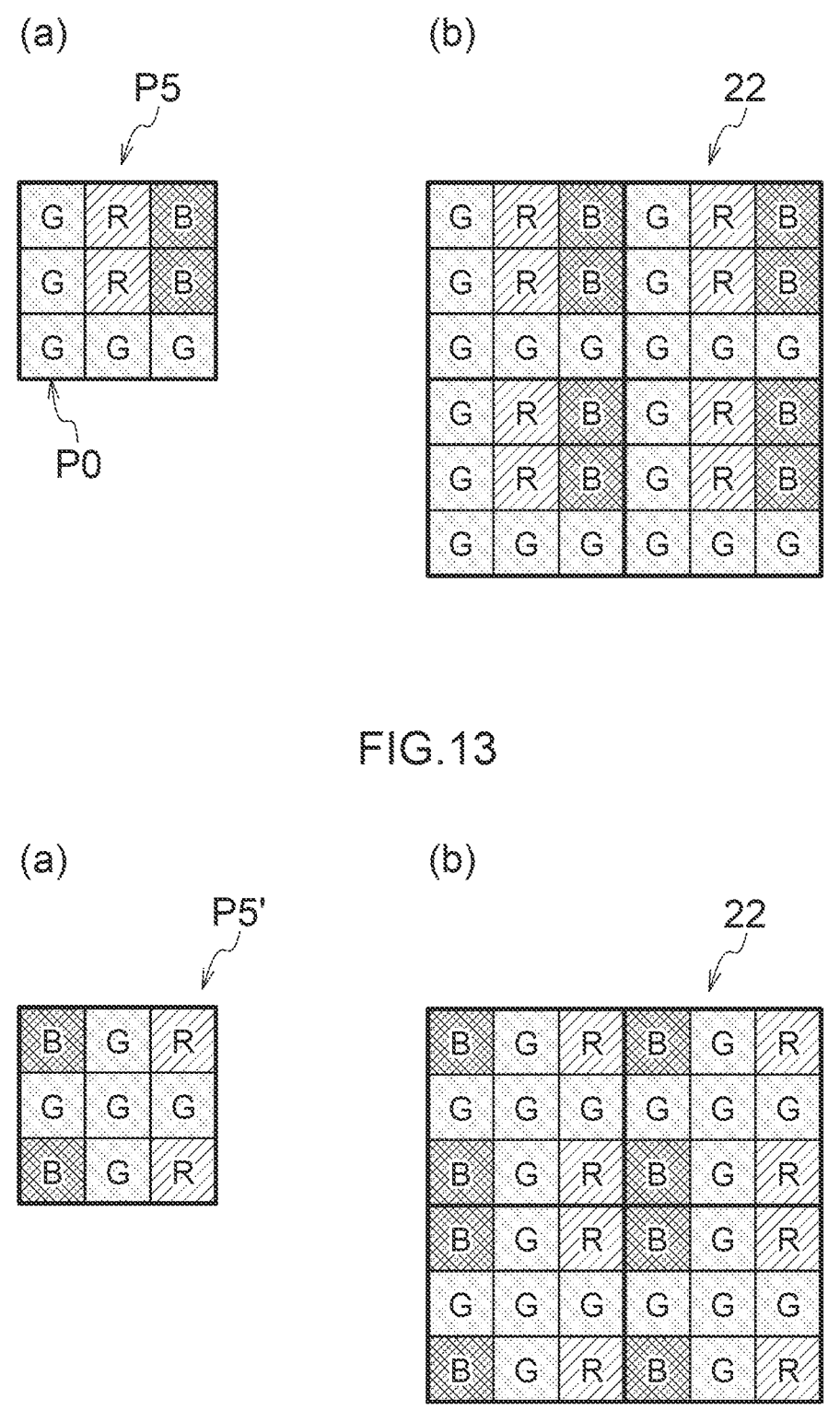

FIG. 12 is a diagram showing a basic array pattern of color filters according to the fifth embodiment, and (a) shows one basic array pattern P5, and (b) shows a state where total of four basic array patterns P5 are disposed, two in the horizontal direction and two in the vertical direction.

In the present embodiment, the explanation of the features which are the same as or similar to those in the above-described third embodiment will be omitted.
[Characteristics (1)]

As shown in FIG. 12, the color filter array 22 according to the present embodiment also includes a basic array pattern P5 which is a square array pattern corresponding to 3×3 pixels in the horizontal direction and in the vertical direction, and this basic array pattern P5 is repeatedly disposed in the horizontal direction and in the vertical direction. Therefore, R filters 23R, G filters 23G and B filters 23B of each color are also periodically arranged, which enables de-mosaic processing, or the like, of R, G and B signals according to the repeating pattern and makes it possible to share a processing circuit before and after thinning processing when the size of an image is reduced by performing thinning processing in units of the basic array pattern P5.
[Characteristics (2)]

Also in the basic array pattern P5 of the present embodiment, three types of filter arrays extending in parallel in the horizontal direction are sequentially arranged in the vertical direction, and "a filter array (first filter array) in which a G filter 23G, an R filter 23R and a B filter 23B are disposed in parallel in the horizontal direction", "a filter array (second filter array) in which a G filter 23G, an R filter 23R and a B filter 23B are disposed in parallel in the horizontal direction" and "a filter array (third filter array) in which a G filter 23G, a G filter 23G and a G filter 23G are disposed in parallel in the horizontal direction" are sequentially arranged in the vertical direction.

Therefore, also in the basic array pattern P5 in this example, G filters 23G are disposed in a peripheral portion Po which configures two adjacent sides among four sides of the array pattern corresponding to 3×3 pixels. Further, in the region corresponding to 2×2 pixels other than the peripheral portion Po, two pixels of R filters 23R and two pixels of B filters 23B are disposed.

However, in this example, in the region corresponding to 2×2 pixels other than the peripheral portion Po, the R filters 23R are disposed in parallel in the vertical direction, and the B filters 23B are disposed in parallel in the vertical direction. Further, the R filters 23R are disposed in parallel at the positions adjacent to the G filters 23G which are disposed in parallel in the vertical direction in the peripheral portion Po of the basic array pattern P5, and the R filter 23R and the B filter 23B are disposed at positions adjacent to the G filters 23G which are disposed in parallel in the horizontal direction in the peripheral portion Po of the basic array pattern P5.

In the color filter array 22 configured by disposing a plurality of the basic array patterns P5, the G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.
[Characteristics (3)]

Because the number of pixels of pixels R, pixels G and pixels B corresponding to the RGB filters 23R, 23G and 23B within the basic array pattern P5 are two pixels, five pixels and two pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which most contribute to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

Also in the color filters including a plurality of basic array patterns P5 as described above, in the NW direction and in the NE direction, a "pixel line comprised of B filters 23B and G filters 23G" and a "pixel line comprised of R filters 23R and G filters 23G" extend across a "pixel line comprised of R filters 23R, G filters 23G and B filters 23B". Therefore, each pixel line including B filters 23B is disposed at a position on one side (one pixel) adjacent to another pixel line including B filters 23B of the same color, and each pixel line including R filters 23R is disposed at a position on one side (one pixel) adjacent to another pixel line including R filters 23R of the same color. In this way, because the RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

It should be noted that there are a plurality of basic array patterns which can configure the color filter array 22 shown in FIG. 12(b), other than the basic array pattern P5 shown in FIG. 12(a), and it is also possible to use the array pattern corresponding to 3×3 pixels obtained by shifting the basic array pattern shown in FIG. 12(a) in the horizontal direction and/or in the vertical direction as the basic array pattern, and it is possible to configure color filters having an array equivalent to the color filter array 22 shown in FIG. 12(b), for example, using an array pattern P5' shown in FIG. 13(a) as the basic array pattern (see FIG. 13(b)).

As described above, the color filters according to the present embodiment have characteristics and advantages which are the same as those of the color filters according to the above-described third embodiment. Particularly, because the color filters according to the present embodiment excel in proximity between the R filters 23R and proximity associated with the B filters 23B in the diagonal directions (NE and NW) as with the color filters according to the third embodiment, it is possible to obtain data of a sharp image with higher resolution by preventing color moire (false color), or the like.

Sixth Embodiment

FIG. 14 is a diagram showing a basic array pattern of color filters according to the sixth embodiment, and (a) shows one basic array pattern P6, and (b) shows a state where total of four basic array patterns P6 are disposed, two in the horizontal direction and two in the vertical direction.

In the present embodiment, the explanation of the features which are the same as or similar to those in the above-described fifth embodiment will be omitted.

[Characteristics (1)]

As shown in FIG. 14, the color filter array 22 according to the present embodiment also includes a basic array pattern P6 which is a square array pattern corresponding to 3×3 pixels in the horizontal direction and in the vertical direction, and this basic array pattern P6 is repeatedly disposed in the horizontal direction and in the vertical direction. Therefore, R filters 23R, G filters 23G and B filters 23B of each color are also periodically arranged, which enables de-mosaic processing, or the like, of R, G and B signals according to the repeating pattern and makes it possible to share a processing circuit before and after thinning processing when the size of an image is reduced by performing thinning processing in units of the basic array pattern P6.

[Characteristics (2)]

Also in the basic array pattern P6 of the present embodiment, three types of filter arrays extending in parallel in the horizontal direction are sequentially arranged in the vertical direction, and "a filter array (first filter array) in which a G filter 23G, a B filter 23B and an R filter 23R are disposed in parallel in the horizontal direction", "a filter array (second filter array) in which a G filter 23G, a B filter 23B and an R filter 23R are disposed in parallel in the horizontal direction" and "a filter array (third filter array) in which a G filter 23G, a G filter 23G and a G filter 23G are disposed in parallel in the horizontal direction" are sequentially arranged in the vertical direction.

Therefore, also in the basic array pattern P6 in this example, G filters 23G are disposed in a peripheral portion Po which configures two adjacent sides among four sides of the array pattern corresponding to 3×3 pixels. Further, in the region corresponding to 2×2 pixels other than the peripheral portion Po, two pixels of R filters 23R and two pixels of B filters 23B are disposed, and in the region corresponding to 2×2 pixels other than the peripheral portion Po, the R filters 23R are disposed in parallel in the vertical direction, and the B filters 23B are disposed in parallel in the vertical direction. Further, the R filter 23R and the B filter 23B are disposed at positions adjacent to the G filters 23G which are disposed in parallel in the horizontal direction in the peripheral portion Po of the basic array pattern P6.

However, in this example, the B filters 23B are disposed in parallel at positions adjacent to the G filters 23G which are disposed in parallel in the vertical direction in the peripheral portion Po of the basic array pattern P6. Therefore, the R filters 23R and the B filters 23B are inversely disposed between the color filters according to the fifth embodiment (basic array pattern P5) and the color filters according to the sixth embodiment (basic array pattern P6).

In the color filter array 22 configured by disposing a plurality of the basic array patterns P6 in parallel, the G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P6 are two pixels, five pixels and two pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

Also in the color filters including a plurality of basic array patterns P6 as described above, in the NW direction and in the NE direction, a "pixel line comprised of B filters 23B and G filters 23G" and a "pixel line comprised of R filters 23R and G filters 23G" extend across a "pixel line comprised of R filters 23R, G filters 23G and B filters 23B". Therefore, each pixel line including B filters 23B is disposed at a position on one side (one pixel) adjacent to another pixel line including B filters 23B of the same color, and each pixel line including R filters 23R is disposed at a position on one side (one pixel) adjacent to another pixel line including R filters 23R of the same color. In this way, because the RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

It should be noted that there are a plurality of basic array patterns which can configure the color filter array 22 shown in FIG. 14(b), other than the basic array pattern P6 shown in FIG. 14(a), and it is also possible to use the array pattern corresponding to 3×3 pixels obtained by shifting the basic array pattern P6 shown in FIG. 14(a) in the horizontal direction and/or in the vertical direction as the basic array pattern, and it is possible to configure color filters having an array equivalent to the color filter array 22 shown in FIG. 14(b), for example, using an array pattern P6' shown in FIG. 15(a) as the basic array pattern (see FIG. 15(b)).

As described above, the color filters according to the present embodiment have characteristics and advantages which are the same as those of the color filters according to the above-described fifth embodiment. Particularly, because the color filters according to the present embodiment excel in proximity between the R filters 23R and proximity associated with the B filters 23B in the diagonal directions (NE and NW) as with the color filters according to the fifth embodiment, it is possible to obtain data of a sharp image with higher resolution by preventing color moire (false color), or the like.

Seventh Embodiment

In the present embodiment, the explanation of the features which are the same as or similar to those in the above-described first to sixth embodiments will be omitted.

Color filters of the present embodiment include a basic array pattern which is an array pattern corresponding to 6×3 pixels or 3×6 pixels (M×N pixels or N×M pixels) in the horizontal direction and in the vertical direction, and are made up by repeatedly disposing this basic array pattern in the horizontal direction and in the vertical direction. Further, this basic array pattern includes two types of sub-arrays corresponding to 3×3 pixels (M×N/2 pixels or N/2×M pixels).

Specifically, among the basic array patterns corresponding to 3×3 pixels according to the above-described first to sixth embodiments (see FIG. 4 to FIG. 15), an array pattern in which arbitrary two types of basic array patterns (a first sub-array and a second sub-array) are disposed in parallel in the horizontal direction or in the vertical direction can be used as the basic array pattern according to the present embodiment.

Particularly, it is preferable that two types of array patterns in which positional relationship of the R filters 23R (first constituting color) and the B filters 23B (second constituting color) other than the G filters 23G (first color) is inverted are combined as the first sub-array and the second sub-array. That is, it is preferable that, in the portion other than the peripheral portion Po which configures two sides of each of the first sub-array and the second sub-array, the positions of the R filters 23R in the first sub-array correspond to the positions of the B filters 23B in the second sub-array, and the positions of the B filters 23B in the first sub-array correspond to the positions of the R filters 23R in the second sub-array.

Examples of such a preferable combination include, for example, a combination of the "basic array pattern P1 according to the first embodiment (see FIG. 4) and the basic array pattern P2 according to the second embodiment (see FIG. 6)", a combination of the "basis array pattern P3 according to the third embodiment (see FIG. 8) and the basic array pattern P4 according to the fourth embodiment (see FIG. 10)", and a combination of the "basic array pattern P5 according to the fifth embodiment (see FIG. 12) and the basic array pattern P6 according to the sixth embodiment (see FIG. 14)".

FIG. 16 shows a basic array pattern P7 of the present embodiment (pixels in the horizontal direction:pixels in the vertical direction=three pixels:six pixels) in which the basic array pattern P1 according to the first embodiment and the basic array pattern P2 according to the second embodiment are combined respectively as the first sub-array (array A) and as the second sub-array (array B) in the vertical direction. FIG. 16(a) shows a combination of the array patterns shown in FIG. 4 and FIG. 6, FIG. 16(b) shows a basic array pattern P7' obtained by shifting the basic array pattern P7 shown in FIG. 16(a) in the horizontal direction, but both drawings show the same color filter array as a whole.

Further, FIG. 17 shows a basic array pattern of the present embodiment (pixels in the horizontal direction:pixels in the vertical direction=six pixels:three pixels) in which the basic array pattern P1 according to the first embodiment and the basic array pattern P2 according to the second embodiment are combined in the horizontal direction respectively as the first sub-array (array A) and as the second sub-array (array B). FIG. 17(a) shows a combination of the array patterns shown in FIG. 4 and FIG. 6, FIG. 17(b) shows a basic array pattern P7' obtained by shifting the basic array pattern P7 shown in FIG. 17(a) in the horizontal direction, but both drawings show the same color filter array as a whole.

The color filters according to the present embodiment shown in FIG. 16 and FIG. 17 have the following characteristics.

[Characteristics (1)]

The color filter array 22 according to the present embodiment also includes the basic array pattern P7 which is an array pattern corresponding to 3×6 pixels or 6×3 pixels in the horizontal direction and in the vertical direction, and this basic array pattern P7 is repeatedly disposed in the horizontal direction and in the vertical direction. Therefore, R filters 23R, G filters 23G and B filters 23B of each color are periodically arranged, so that it is possible to perform de-mosaic processing, or the like, of R, G and B signals according to the repeating pattern, and can share a processing circuit before and after thinning processing when the size of an image is reduced by performing thinning processing in units of the basic array pattern P7.

[Characteristics (2)]

In each sub-array of the basic array pattern P7 of the present embodiment, G filters 23G are disposed in the peripheral portion Po which configures two adjacent sides among four sides of the array pattern corresponding to 3×3 pixels.

Further, in the region corresponding to 2×2 pixels other than the peripheral portion Po, two pixels of R filters 23R and two pixels of B filters 23B are disposed, and in the region corresponding to 2×2 pixels other than the peripheral portion Po, R filters 23R are disposed in parallel in one of the diagonal directions in the portion other than the peripheral portion Po which configures two sides of the sub-array, and B filters 23B are disposed in parallel in the other of the diagonal directions. The positional relationship of the R filters 23R and the B filters 23B is inverted between the first sub-array and the second sub-array.

In the color filter array 22 configured by disposing a plurality of the basic array patterns P7 in parallel, G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P7 are four pixels, ten pixels and four pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

Also in the color filters including a plurality of basic array patterns P7 as described above, a pixel line comprised of at least six pixels or more extending in the NW direction and in the NE direction becomes a "pixel line comprised of R filters 23R, G filters 23G and B filters 23B", and color filters corresponding to all the colors (the first color and the second color) are disposed. Therefore, as to the R filter 23R and the B filter 23B as well as the G filter 23G, other pixel lines including the R filters 23R and the B filters 23B of the same color are disposed at positions (one pixel) adjacent to the pixel line in the NW direction and in the NE direction. In this way, because the RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

As described above, the color filters according to the present embodiment have characteristics and advantages which are the same as those of the color filters according to the above-described each embodiment. Particularly, in the color filters according to the present embodiment, the R filters 23R, the G filters 23G and the B filters 23B are disposed respectively adjacent to each other in the diagonal directions (NE and NW), so that it is possible to obtain data of a sharp image with high resolution by preventing color moire (false color), or the like.

Eighth Embodiment

In the present embodiment, the explanation of the features which are the same as or similar to those in the above-described first to seventh embodiments will be omitted.

The color filters according to the present embodiment include a basic array pattern arranged in an array pattern corresponding to 6×6 pixels (M×M pixels) in the horizontal direction and in the vertical direction, and are configured by repeatedly disposing this basic array pattern in the horizontal direction and in the vertical direction. Further, this basic array pattern includes two types of sub-arrays corresponding to 3×3 pixels (M/2×M/2 pixels).

Specifically, it is possible to use as the basic array pattern according to the present embodiment, an array pattern including arbitrary two types of basic array patterns (the first sub-array and the second sub-array) two patterns each among the basic array patterns corresponding to 3×3 pixels according to the above-described first to sixth embodiments (see FIG. 4 to FIG. 15), in which the first sub-arrays and the second sub-arrays are disposed adjacent to each other in parallel in the horizontal direction and in the vertical direction.

Particularly, it is preferable that two types of array patterns in which positional relationship of the R filters 23R (first constituting color) and the B filters 23B (second constituting color) other than the G filters 23G (first color) is inverted are combined as the first sub-array and the second sub-array. Examples of such a preferable combination include, for example, a combination of the "basic array pattern P1 according to the first embodiment (see FIG. 4) and the basic array pattern P2 according to the second embodiment (see FIG. 6)", a combination of the "basic array pattern P3 according to the third embodiment (see FIG. 8) and the basic array pattern P4 according to the fourth embodiment (see FIG. 10)" and a combination of the "basic array pattern P5 according to the fifth embodiment (see FIG. 12) and the basic array pattern P6 according to the sixth embodiment (see FIG. 14)".

FIG. 18 shows a basic array pattern P8 of the present invention in which the basic array pattern P3 according to the third embodiment and the basic array pattern P4 according to the fourth embodiment are combined respectively as the first sub-array (array A) and as the second sub-array (array B). FIG. 18(*a*) shows a combination of the array patterns shown in FIG. 6 and FIG. 8, FIG. 18(*b*) shows a basic array pattern P8' obtained by shifting the basic array pattern P8 shown in FIG. 18(*a*) in the horizontal direction and in the vertical direction, but both drawings show the same color filter array as a whole. In the basic array pattern P8 (P8') shown in FIG. 18, the first sub-arrays are disposed in parallel in the diagonal direction, the second sub-arrays are disposed in parallel in the diagonal direction, and the first sub-arrays are adjacent to the second sub-arrays in the horizontal direction and in the vertical direction.

The color filters according to the present embodiment shown in FIG. 18 have the following characteristics.

[Characteristics (1)]

The color filter array 22 according to the present embodiment also includes the basic array pattern P8 which is an array pattern corresponding to 6×6 pixels in the horizontal direction and in the vertical direction, and the basic array pattern P8 is repeatedly disposed in the horizontal direction and in the vertical direction. Therefore, R filters 23R, G filters 23G and B filters 23B of each color are periodically arranged, so that it is possible to perform de-mosaic processing, or the like of R, G and B signals according to the repeating pattern and share a processing circuit before and after thinning processing when the size of an image is reduced by performing thinning processing in units of the basic array pattern P8.

[Characteristics (2)]

In each sub-array of the basic array pattern P8 of the present embodiment, G filters 23G are disposed in the peripheral portion Po which configures two adjacent sides among four sides of the array pattern corresponding to 3×3 pixels.

Further, in the region corresponding to 2×2 pixels other than the peripheral portion Po, two pixels of R filters 23R and two pixels of B filters 23B are disposed, and in the region corresponding to 2×2 pixels other than the peripheral portion Po which configures two sides of the sub-array, R filters 23R are disposed in parallel in the horizontal direction, and B filters 23B are disposed in parallel in the horizontal direction. The positional relationship of the R filters 23R and the B filters 23B is inverted between the first sub-array and the second sub-array.

In the color filter array 22 configured by disposing a plurality of the basic array patterns P8 in parallel, G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P8 are eight pixels, twenty pixels and eight pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

In the color filters including a plurality of basic array patterns P8 described above, in the NW direction and in the NE direction, two "pixel lines comprised of B filters 23B and G filters 23G" and two "pixel lines comprised of R filters 23R and G filters 23G" extend across a "pixel line comprised of R filters 23R, G filters 23G and B filters 23B", and these pixel lines exist at a ratio of 1:2:2. In this way, because the RB filters 23R and 23B are respectively disposed in close pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

As described above, the color filters according to the present embodiment have the same characteristics and advantages as those of the color filters according to the above-described embodiments. Particularly, in the color filters according to the present embodiment, each proximity of the R filters 23R, the G filters 23G and the B filters 23B is high in the diagonal directions (NE and NW), so that it is possible to obtain data of a sharp image with high resolution by preventing color moire (false color), or the like.

Ninth Embodiment

In the present embodiment, the explanation of the features which are the same as or similar to those in the above-described first to eighth embodiments will be omitted.

The color filters of the present embodiment include a basic array pattern arranged in an array pattern corresponding to 6×6 pixels (M×M pixels) in the horizontal direction and in the vertical direction, and are configured by repeatedly disposing this basic array pattern in the horizontal direction and in the vertical direction. Further, this basic array pattern includes four types of sub-arrays corresponding to 3×3 pixels (M/2× M/2 pixels).

Specifically, the basic array pattern includes arbitrary four types of basic array patterns (the first sub-array, the second sub-array, the third sub-array and the fourth sub-array) among the basic array patterns corresponding to 3×3 pixels according to the above-described first to sixth embodiments (see FIG. 4 to FIG. 15).

Particularly, it is preferable that array patterns in which the positional relationship of the R filters 23R (first constituting color) and the B filters 23B (second constituting color) other than the G filters 23G (first color) is inverted are disposed in parallel in the diagonal direction. Examples of such a preferable combination include, for example, a combination in which the basic array pattern P3 according to the third embodiment (see FIG. 8) is used as the first sub-array (array A), the basic array pattern P4 according to the fourth embodiment (see FIG. 10) is used as the second sub-array (array B), the basic array pattern of P5 according to the fifth embodiment (see FIG. 12) is used as the third sub-array (array C) and the basic array pattern P6 according to the sixth embodiment (see FIG. 14) is used as the fourth sub-array (array D), the first sub-array and the second sub-array are disposed in parallel in one of the diagonal directions, and the third sub-array and the fourth sub-array are disposed in parallel in the other of the diagonal directions.

Figure 19:
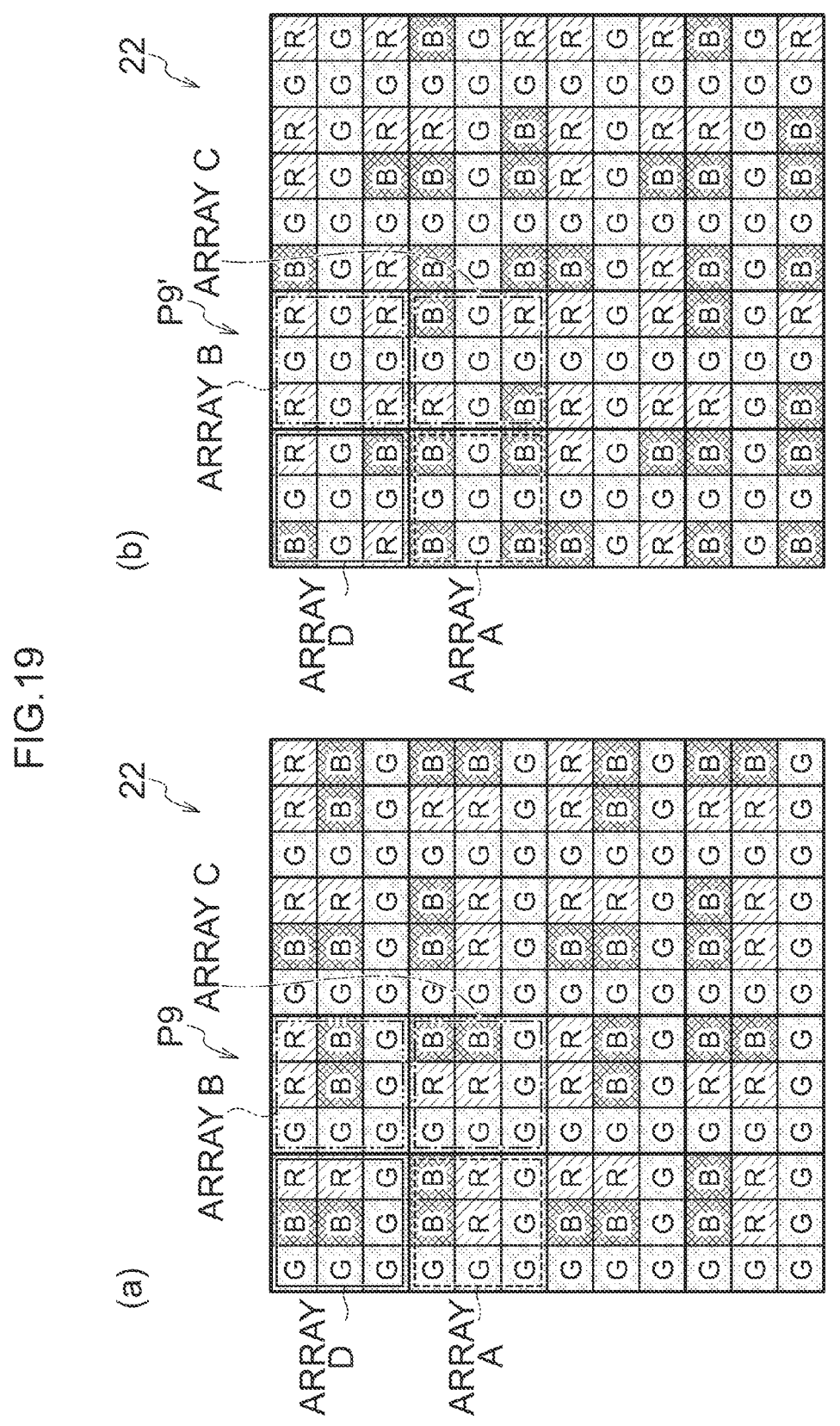

FIG. 19 shows a basic array pattern P9 of the present embodiment in which the basic array patterns according to the third to sixth embodiments are combined as the first sub-array to the fourth sub-array (array A, array B, array C and array D). FIG. 19(a) shows a combination of the array patterns shown in FIG. 8, FIG. 10, FIG. 12 and FIG. 14, FIG. 19(b) shows a basic array pattern P9' obtained by shifting the basic array pattern P9 shown in FIG. 19(a) in the horizontal direction and in the vertical direction, but both drawings show the same color filter array as a whole.

The color filters according to the present embodiment shown in FIG. 19 have the following characteristics.

[Characteristics (1)]

The color filter array 22 according to the present embodiment also includes the basic array pattern P9 (P9') which is an array pattern corresponding to 6×6 pixels in the horizontal direction and in the vertical direction, and this basic array pattern P9 is repeatedly disposed in the horizontal direction and in the vertical direction. Therefore, R filters 23R, G filters 23G and B filters 23B of each color are periodically arranged, so that it is possible to perform de-mosaic processing, or the like, of R, G and B signals according to the repeating pattern, and share a processing circuit before and after thinning processing when the size of an image is reduced by performing thinning processing in units of the basic array pattern P9.

[Characteristics (2)]

In each sub-array of the basic array pattern P9 of the present embodiment, G filters 23G are disposed in the peripheral portion Po which configures two adjacent sides among four sides of the array pattern corresponding to 3×3 pixels.

Further, in the region corresponding to 2×2 pixels other than the peripheral portion Po, two pixels of R filters 23R and two pixels of B filters 23B are disposed, and in the region corresponding to 2×2 pixels other than the peripheral portion Po which configures two sides of the sub-array, R filters 23R are disposed in parallel in the horizontal direction (the first sub-array and the second sub-array) or in the vertical direction (the third sub-array and the fourth sub-array), and B filters 23B are disposed in parallel in the horizontal direction (the first sub-array and the second sub-array) or in the vertical direction (the third sub-array and the fourth sub-array). Particularly, in this example, the positional relationship of the R filters 23R and the B filters 23B is inverted between the first sub-array and the second sub-array which are disposed on one of the diagonal directions, and the positional relationship of the R filters 23R and the B filters 23B is inverted between the third sub-array and the fourth sub-array which are disposed on the other of the diagonal directions.

The color filter array 22 configured by disposing a plurality of the basic array patterns P9 in parallel, G filters 23G are disposed within each pixel line of the horizontal direction (H), the vertical direction (V) and the diagonal directions (NE and NW), so that it is possible to improve reproduction precision of de-mosaic processing in a high frequency range regardless of a direction of a high frequency in the input image.

[Characteristics (3)]

Because the number of pixels of pixels R, pixels G and pixels B corresponding to the RGB filters 23R, 23G and 23B within the basic array pattern P9 are eight pixels, twenty pixels and eight pixels (2:5:2), the ratio of the number of pixels of the pixels G which contribute most to obtain a brightness signal is higher than the respective ratios of the numbers of pixels of the pixels R and the pixels B. Therefore, because the ratio of the number of pixels of the pixels G which contribute most to obtain a brightness signal is higher than the respective ratios of the numbers of pixels of the pixels R and the pixels B, it is possible to suppress aliasing in de-mosaic processing and realize favorable high frequency reproducibility.

[Characteristics (4)]

In the color filter array including a plurality of basic array patterns P9 as described above, a pixel line comprised of at least six pixels or more extending in the NW direction and in the NE direction becomes a "pixel line comprised of R filters 23R, G filters 23G and B filters 23B". Therefore, as to the R filter 23R and the B filter 23B as well as the G filter 23G, other pixel lines including the R filters 23R and the B filters 23B of the same color are disposed at positions (one pixel) adjacent to the pixel line in the NW direction and in the NE direction. In this way, because the RB filters 23R and 23B exist in the close (adjacent) pixel lines extending in the diagonal directions (NE and NW), it is possible to effectively suppress color moire (false color) which may occur by an input image having a high frequency component in the diagonal directions (NE and NW), so that it is possible to perform de-mosaic processing of pixels R and pixels B with high accuracy.

As described above, the color filters according to the present embodiment have characteristics and advantages which are the same as those of the color filters according to the above-described embodiments. Particularly, in the color filters according to the present embodiment, the R filters 23R, the G filters 23G and the B filters 23B are respectively disposed adjacent to one another in the diagonal directions (NE and NW), so that it is possible to obtain data of a sharp image with high resolution by preventing color moire (false color), or the like.

Modified Example

While examples have been described in the above-described respective embodiments, where green (G) is employed as the first color, red (R) and blue (B) are employed as the second color, colors which can be used in the color filters are not limited to these colors, and it is also possible to use color filters corresponding to colors which satisfy the following conditions.

<Conditions for First Filter (First Color)>

While examples have been provided for explanation in the above-described respective embodiments where a G filter 23G of color G is used as the first filter of the first color of the present invention, it is also possible to use a filter which satisfies any of the following conditions (1) to (4) in place of the G filter 23G or in place of part of the G filter 23G.

[Condition (1)]

Condition (1) is that the first filter should have a contribution ratio of 50% or higher to obtain a brightness signal. This contribution ratio of 50% is a value defined for distinguishing between the first color (such as a color G) and the second color (such as colors R and B) of the present invention, and is a value defined so that a color having a contribution ratio to obtain a brightness signal which is relatively higher than those of the color R and the color B is included in the "first color". Because the contribution ratio of the color G is 60% as indicated in the above equation (1), the condition (1) is satisfied. Further, the contribution ratios of colors other than the color G can be also obtained through experiments and simulations. Therefore, a filter having a color whose contribution ratio is 50% or higher, other than the color G can also be used as the first filter of the present invention. It should be noted that a color whose contribution ratio is lower than 50% is used as the second color (such as the color R and the color B) of the present invention, and a filter having this color is used as the second filter of the present invention.

[Condition (2)]

Condition (2) is that the first filter should have a peak of the transmittance which falls within a range of a wavelength between 480 nm and 570 nm. As the transmittance of the filter, for example, a value measured at a spectrophotometer is used. This wavelength range is a range defined for distinguishing between the first color (such as a color G) and the second color (such as a color R and a color B) of the present invention, and defined so that the range does not include peaks of the aforementioned color R, the color B, or the like whose contribution ratio is relatively low and includes a peak of the color G, or the like whose contribution ratio is relatively high. Therefore, the filter whose peak of transmittance falls within a range of a wavelength between 480 nm and 570 nm can be used as the first filter. It should be noted that the filter whose peak of transmittance falls outside the range of the wavelength between 480 nm and 570 nm is used as the second filter (R filter 23R and B filter 23B) of the present invention.

[Condition (3)]

Condition (3) is that the first filter should have transmittance higher than that of the second filter (an R filter 23R and a B filter 23B) within a range of a wavelength between 500 nm and 560 nm. Also in this condition (3), for example, a value measured at a spectrophotometer is used as the transmittance of the filter. The wavelength range of the condition (3) is also a range defined for distinguishing between the first color (such as a color G) and the second color (such as a color R and a color B) of the present invention, and a range in which the transmittance of a filter having color whose aforementioned contribution ratio is relatively higher than those of the color R, color B, or the like, is higher than the transmittance of the RB filters 23R and 23B, or the like. It is therefore possible to use a filter whose transmittance is relatively high within the range of the wavelength between 500 nm and 560 nm as the first filter and use a filter whose transmittance is relatively low as the second filter.

[Condition (4)]

Condition (4) is that a filter having two or more colors including a color which contributes most to a brightness signal among three primary colors (for example, a color G among RGB) and a color different from the three primary colors should be used as the first filter. In this case, a filter corresponding to colors other than the color of the first filter is used as the second filter.

<A Plurality of Types of First Filters (G Filter)>

Therefore, a G filter 23G of the color G as the first filter is not limited to one type, and, for example, a plurality of types of G filters 23G can be also used as the first filter. That is, the G filter 23G of the color filters (basic array pattern) according to the above-described respective embodiments may be replaced with the first G filter 23G1 or the second G filter 23G2 as appropriate. The first G filter 23G1 transmits light G of a first wavelength band, and the second G filter 23G2 transmits light G of a second wavelength band which has high correlation with the first G filter 23G1 (see FIG. 20).

As the first G filter 23G1, an existing G filter (for example, the G filter 23G in the first embodiment) can be used. Further, as the second G filter 23G2, a filter having high correlation with the first G filter 23G1 can be used. In this case, it is desirable that a peak value of the spectral sensitivity curve of a light receiving element in which the second G filter 23G2 is disposed falls within a range of a wavelength, for example, between 500 nm and 535 nm (near a peak value of the spectral sensitivity curve of a light receiving element in which the existing G filter is disposed). It should be noted that as a method for determining color filters of four colors (R, G1, G2 and B), for example, the method disclosed in Japanese Patent Application Laid-Open No. 2003-284084 is used.

In this way, by using four types of colors to acquire an image using the color imaging element so as to increase acquired color information, it is possible to depict colors more accurately compared to a case where only three types of colors (RGB) are acquired. That is, it is possible to reproduce different colors which can be distinguished by eyes as different colors and to reproduce the same colors which are seen as the same colors (improve "distinction of colors").

It should be noted that because the transmittance of the first and the second G filters 23G1 and 23G2 is basically the same as the transmittance of the G filter 23G of the first embodiment, the contribution ratio to obtain a brightness signal is higher than 50%. Therefore, the first and second G filters 23G1 and 23G2 satisfy the aforementioned condition (1).

Figure 20:
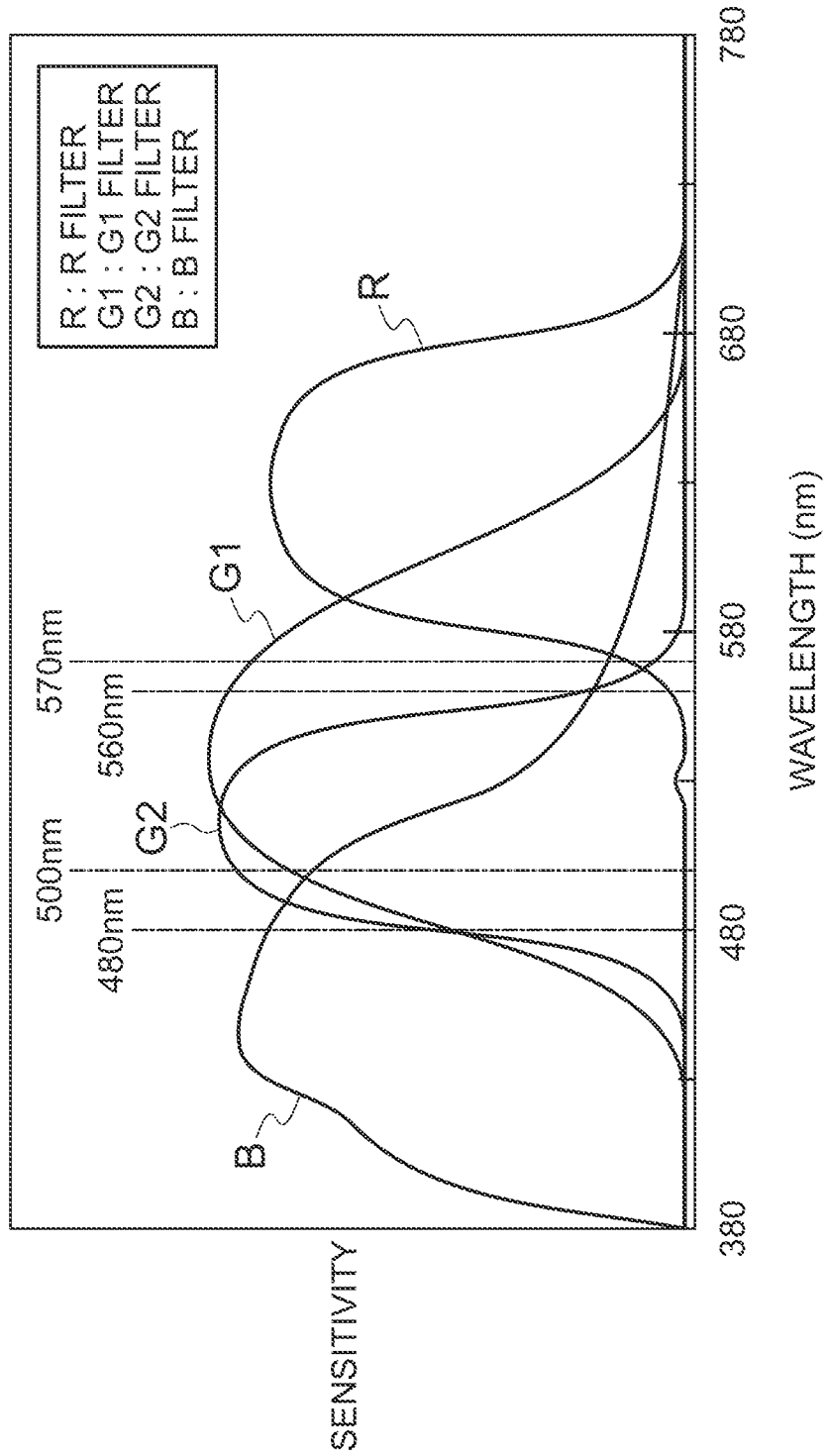
FIG. 20 is a graph showing spectral sensitivity characteristics of light receiving elements in which an R filter (red filter), a G1 filter (first green filter), a G2 filter (second green filter) and a B filter (blue filter) are disposed.

Further, in FIG. 20 which shows spectral sensitivity characteristics of the color filter array (light receiving element), peaks of the transmittance of the G filters 23G1 and 23G2 (peaks of sensitivity of the respective pixels G) fall within a range of a wavelength between 480 nm and 570 nm. The transmittance of the G filters 23G1 and 23G2 is higher than the transmittance of the RB filters 23R and 23B within a range of a wavelength between 500 nm and 560 nm. Therefore, the G filters 23G1 and 23G2 also satisfy the aforementioned conditions (2) and (3).

It is also possible to change disposition and the number of the G filters 23G1 and 23G2 as appropriate. Further, it is also possible to increase the types of G filters 23G to three or more.

<Transparent Filter (W Filter)>

While, in the above-described embodiments, a color filter comprised of color filters mainly corresponding to RGB colors have been described, a transparent filter W (white pixel) may be used in place of part of these color filters. Particularly, it is preferable that a transparent filter W is disposed in place of part of the first filter (G filter 23G). By replacing part of the pixels G with white pixels in this way, it is possible to suppress degradation of color reproducibility even if a pixel size is made finer.

The transparent filter W is a filter of a transparent color (first color). The transparent filter W can transmit light corresponding to a wavelength band of visible light, and, is, for example, a filter whose transmittance of light of colors of RGB is 50% or higher. Because the transmittance of the transparent filter W is higher than the G filter 23G, a contribution ratio to obtain a brightness signal is also higher than that of color G (60%), and thus the transparent filter W satisfies the aforementioned condition (1).

Figure 21:
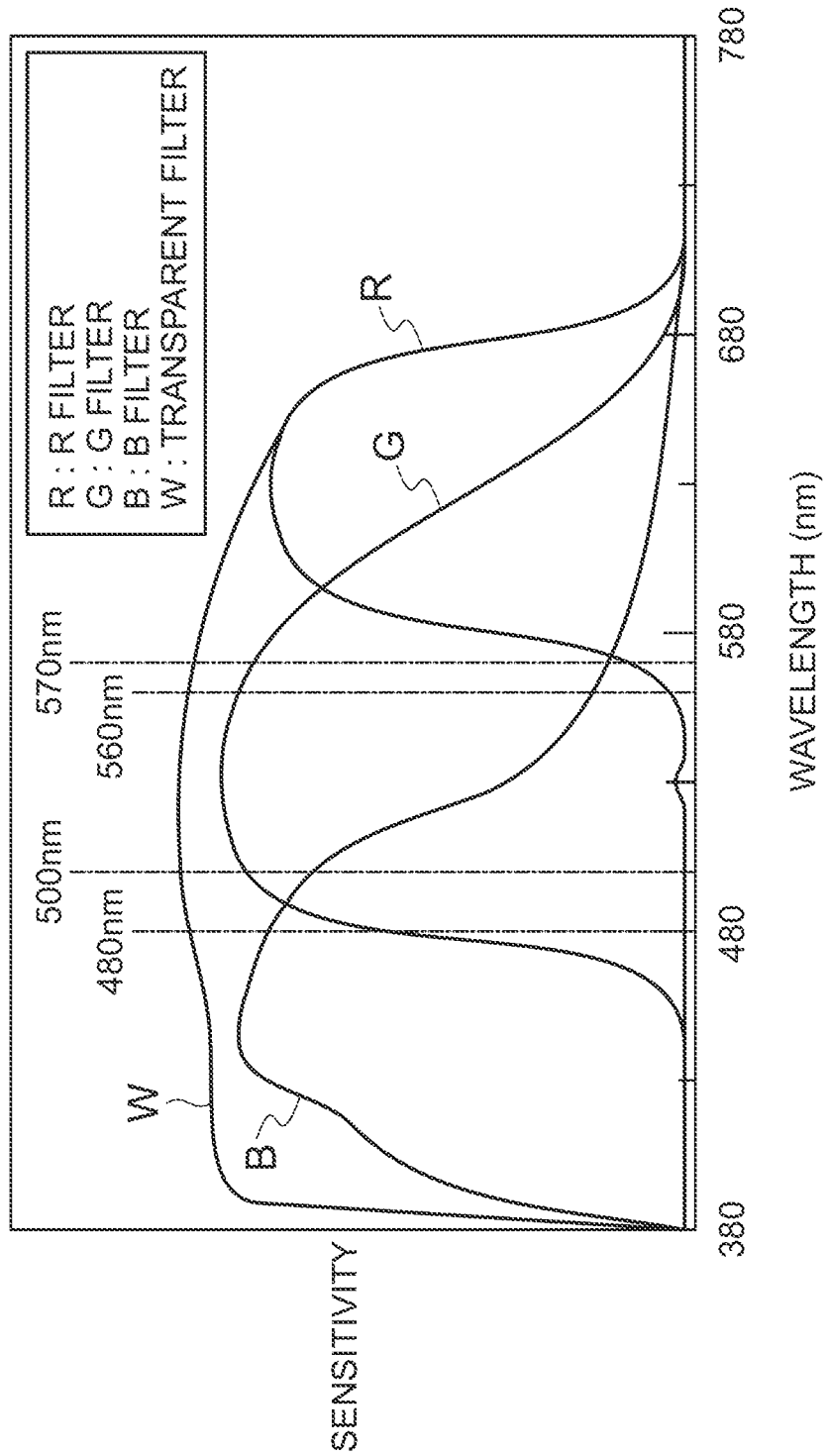
FIG. 21 is a graph showing spectral sensitivity characteristics of light receiving elements in which an R filter, a G filter, a B filter and a W filter (transparent filter) are disposed.

In FIG. 21 which shows spectral sensitivity characteristics of the color filter array (light receiving element), a peak of the transmittance of the transparent filter W (peak of sensitivity of white pixels) falls within a range of a wavelength between 480 nm and 570 nm. Further, the transmittance of the transparent filter W is higher than the transmittance of the RB filters 23R and 23B within a range of a wavelength between 500 nm and 560 nm. Therefore, the transparent filter W also satisfies the aforementioned conditions (2) and (3). It should be noted that the G filter 23G also satisfies the aforementioned conditions (1) to (3) as with the transparent filter W.

As described above, because the transparent filter W satisfies the aforementioned conditions (1) to (3), the transparent filter W can be used as the first filter of the present invention. It should be noted that in the color filter array, because part of the G filters 23G corresponding to color G which contributes most to a brightness signal among three primary colors of RGB is replaced with the transparent filter W, the color filter array also satisfies the aforementioned condition (4).

<Emerald Filter (E Filter)>

While in the above-described embodiments, a color filter comprised of color filters mainly corresponding to RGB colors has been described, part of these color filters may be replaced with filters of other colors, and, for example, a filter E (emerald pixel) corresponding to emerald (E) color may be used. Particularly, it is preferable that the emerald filter (E filter) is disposed in place of part of the first filter (G filter 23G). By using the color filter array of four colors in which part of the G filters 23G is replaced with the E filters in this way, it is possible to improve reproducibility of a high frequency component of brightness, reduce jagginess and improve resolution feeling.

Figure 22:
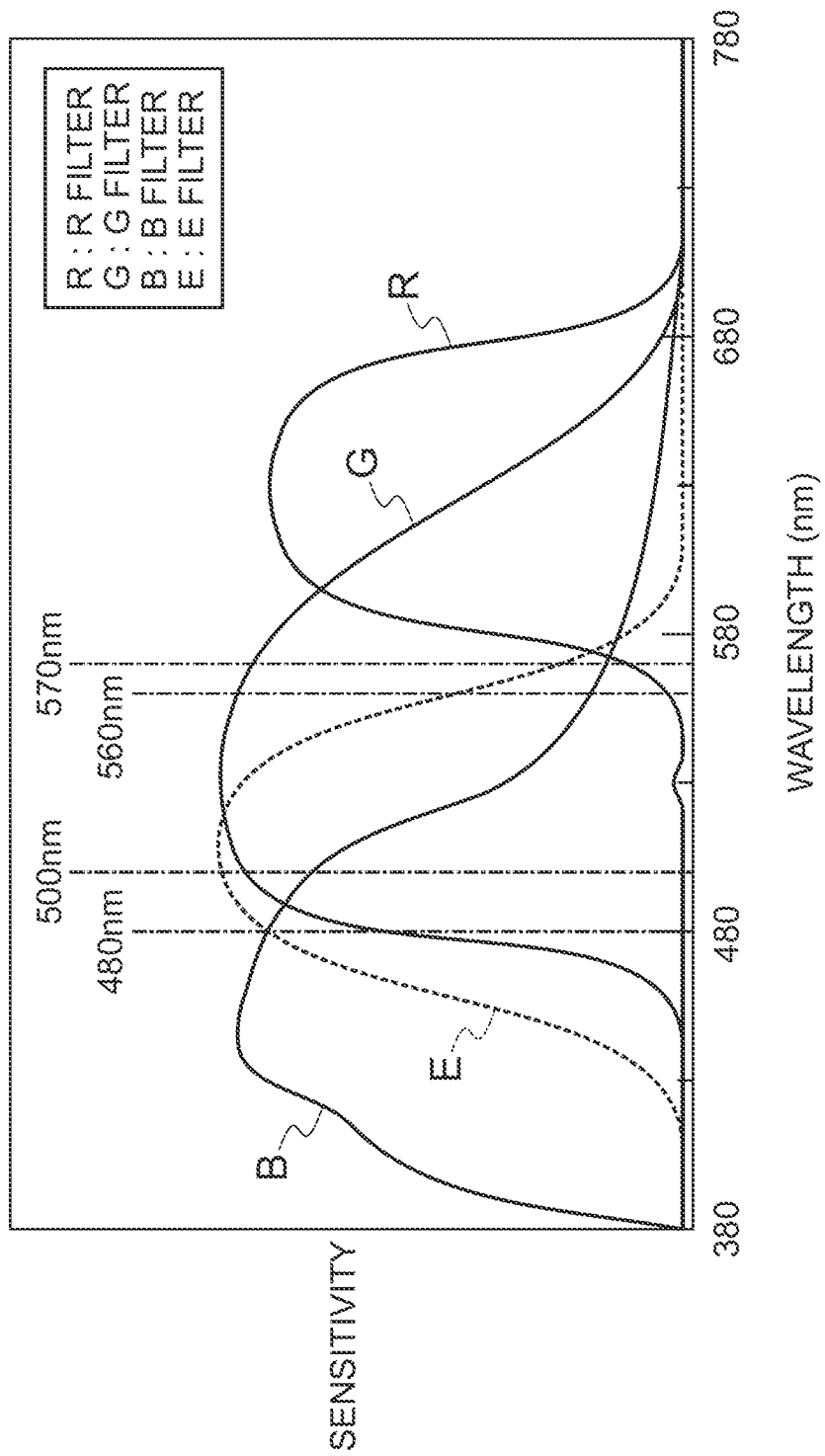
FIG. 22 is a graph showing spectral sensitivity characteristics of light receiving elements in which an R filter, a G filter, a B filter and an emerald filter E (E filter) are disposed.

In FIG. 22 which shows spectral sensitivity characteristics of the color filter array (light receiving element), a peak of the transmittance of the emerald filter E (peak of sensitivity of the pixel E) falls within a range of a wavelength between 480 nm and 570 nm. Further, the transmittance of the emerald filter E is higher than the transmittance of the RB filters 23R and 23B within a range of a wavelength between 500 nm and 560 nm. Therefore, the emerald filter E satisfies the aforementioned conditions (2) and (3). Further, because in the color filter array, part of the G filters 23G corresponding to color G which contributes most to a brightness signal among three primary colors of RGB is replaced with the emerald filter E, the color filter array also satisfies the aforementioned condition (4).

It should be noted that while, in the spectral characteristics shown in FIG. 22, the emerald filter E has a peak at a shorter wavelength side than the G filter 23G, there is a case where the emerald filter E has a peak at a longer wavelength side than the G filter 23G (appears in a color slightly closer to yellow). As described above, it is possible to select a filter which satisfies each condition of the present invention as the emerald filter E, and, for example, it is possible to select an emerald filter E which satisfies the condition (1).

<Types of Other Colors>

While, in the above-described respective embodiments, the color filter array comprised of color filters of primary colors RGB has been described, the present invention can be applied to a color filter array of, for example, color filters including a complementary color system of four colors C (cyan), M (magenta) and Y (yellow) which are complementary colors of the primary colors RGB, and G. Also in this case, a color filter which satisfies any of the above-described conditions (1) to (4) is used as the first filter of the present invention, and the other color filters are used as the second filter.

<Honeycomb Arrangement>

While each color filter array of the above-described each embodiment includes a basic array pattern in which color filters of each color are arranged in two dimensions in the horizontal direction (H) and in the vertical direction (V), and this basic array pattern is repeatedly disposed in the horizontal direction (H) and in the vertical direction (V), the present invention is not limited to this.

For example, it is also possible to configure color filters using an array pattern in which a basic array pattern in a so-called honeycomb array obtained by rotating the basic array pattern of the above-described each embodiment by 45° around an optical axis is repeatedly disposed in the diagonal directions (NE and NW). In this case, the diagonal directions (NE and NW) correspond to the first and the second directions of the present invention, and the horizontal and vertical directions correspond to the third and the fourth directions of the present invention.

Figure 23:
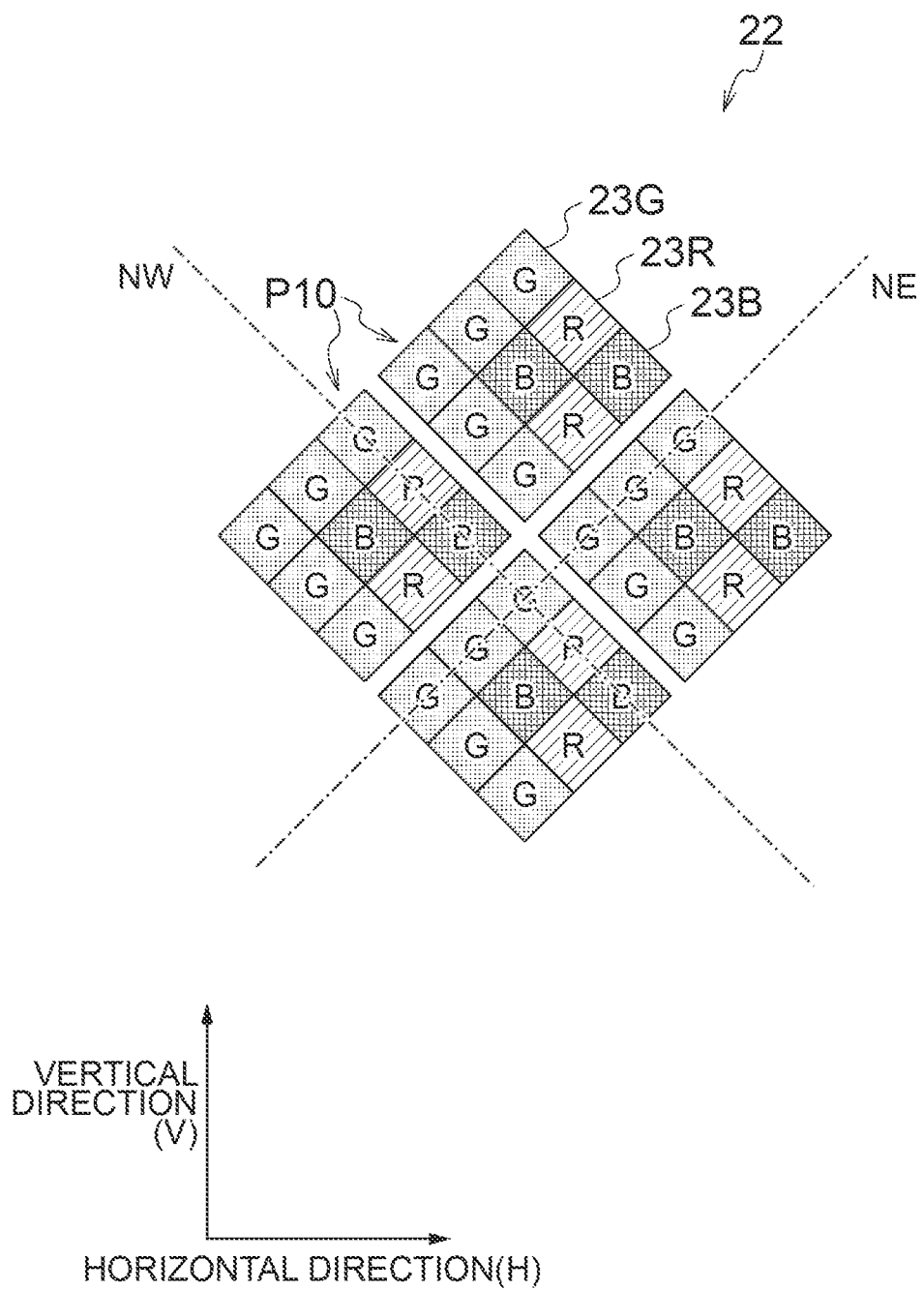
FIG. 23 is a front view showing one example of a color filter array in honeycomb arrangement.

FIG. 23 shows a color filter array using an array in which the basic array pattern P1 according to the above-described first embodiment is arranged in a honeycomb shape as a basic array pattern P10.

<The Number of Pixels Configuring Basic Array Pattern>

While, in the above-described embodiments, the basic array pattern corresponding to 3×3 pixels, the basic array pattern corresponding to 3×6 pixels (6×3 pixels) and the basic array pattern corresponding to 6×6 pixels have been described, the corresponding number of pixels of the basic array pattern is not limited to these.

That is, it is possible to dispose the second filter (a red filter and a blue filter) in the portion other than the peripheral portion so that the ratio of the total number of pixels of the first color (such as green) corresponding to the first filter (such as a G filter) is higher than the respective ratios of the numbers of pixels of the second color (such as red and blue) corresponding to the second filter (such as an R filter and a B filter), the first filter (such as a G filter) is disposed in the peripheral portion configuring two adjacent sides among four side of the basic array pattern or sub-array patterns configuring the basic array pattern, and the ratio of the number of pixels of the second color (such as red and blue) is higher than the ratio of the number of pixels of the first color (green) in the portion other than the peripheral portion configuring the two sides. It should be noted that, in this case, the array pattern corresponding to M×M (where M is an integer of three or greater) pixels may be used as the basic array pattern. Further, an array pattern corresponding to M×N (where M is an integer of three or greater and N is an even number of six or greater) pixels may be used as the basic array pattern while an array pattern corresponding to M×(N/2) pixels may be used as the sub-array pattern. Further, an array pattern corresponding to M×M (where M is an even number of six or greater) pixels may be used as the basic array pattern, while an array pattern corresponding to (M/2)×(M/2) pixels may be used as the sub-array pattern.

It should be noted that it is preferable that the second filter (such as an R filter and a B filter) other than the first filter (such as a G filter) is disposed in a central pixel (or a central pixel group) at the portion other than the peripheral portion configuring two adjacent sides among four sides of the basic array pattern or the sub-array patterns. In this case, it is possible to increase a ratio of arrangement of the second filter (such as an R filter and a B filter), and effectively prevent space between the second filters (such as between R filters and between B filters) from becoming too large, so that it is possible to provide a color filter which excels in reproducibility of colors corresponding to the second filter.

Figure 24:
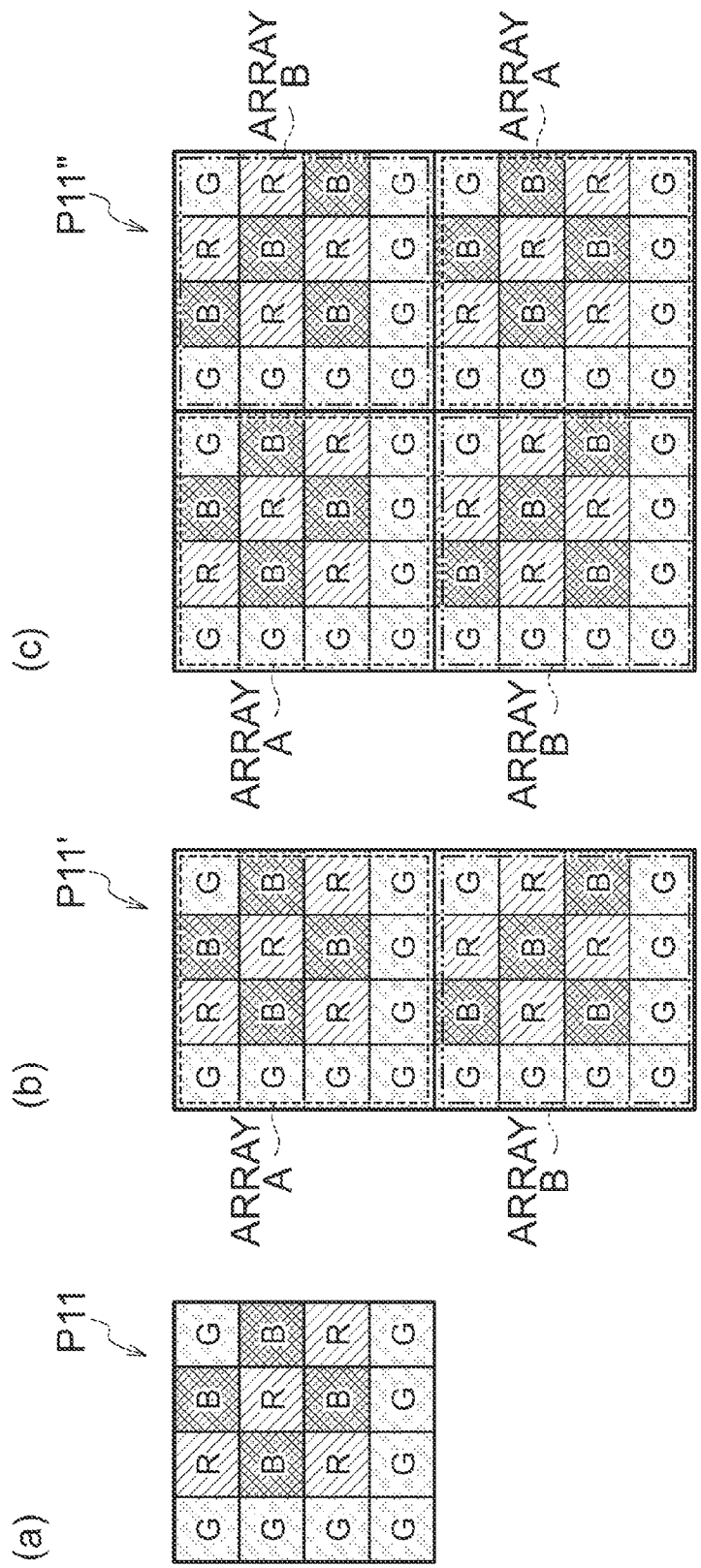
FIG. 24 is a front view showing another example of the basic array pattern, (a) is a diagram showing one example of the basic array pattern corresponding to 4×4 pixels, (b) is a diagram showing one example of the basic array pattern corresponding to 4×8 pixels, and (c) is a diagram showing one example of the basic array pattern corresponding to 8×8 pixels.
Figure 25:
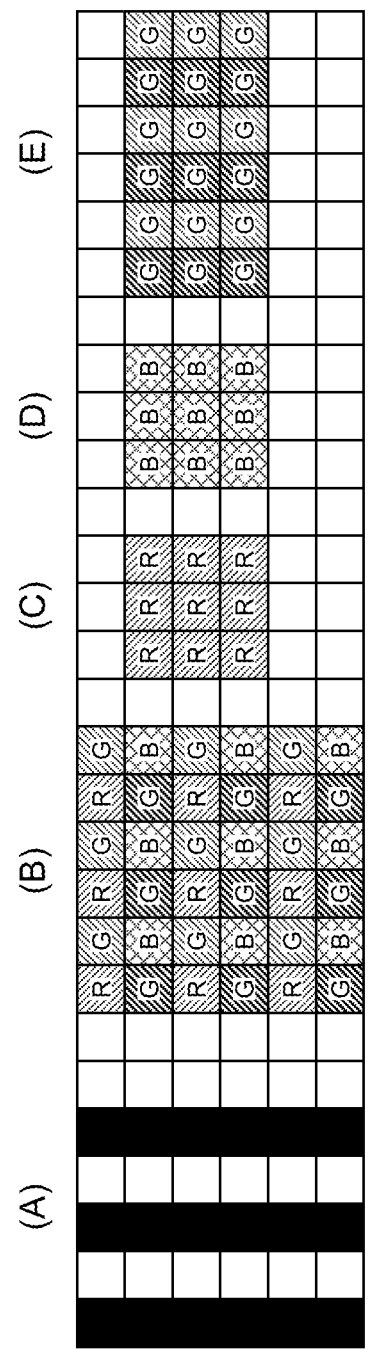
FIG. 25 is a diagram used for explaining a problem of a color imaging element having color filters of the conventional Bayer array.
Figure 26:
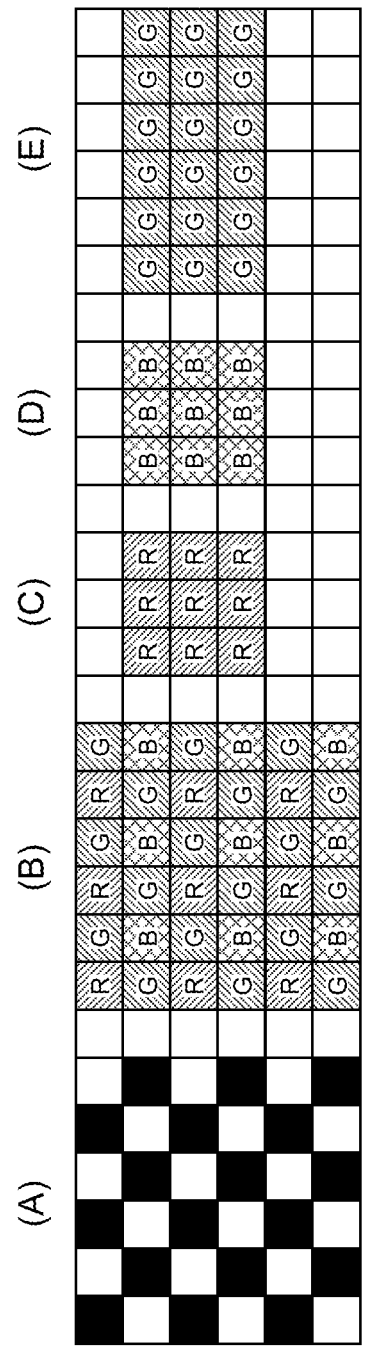
FIG. 26 is another diagram used for explaining a problem of a color imaging element having color filters of the conventional Bayer array.

For example, as shown in FIG. 24(*a*), it is also possible to configure a color filter using a basic array pattern P11 corresponding to 4×4 pixels in the vertical direction and in the horizontal direction (the first filter array: a G filter 23G, an R filter 23R, a B filter 23B and a G filter 23G; the second filter array: a G filter 23G, a B filter 23B, an R filter 23R and a B filter 23B; the third filter array: a G filter 23G, an R filter 23R, a B filter 23B and an R filter 23R; and the fourth filter array: a G filter 23G, a G filter 23G, a G filter 23G and a G filter 23G). Further, it is also possible to use as a basic array pattern P11' an array pattern corresponding to 4×8 pixels shown in FIG. 24(*b*) in which the array pattern shown in FIG. 24(*a*) is used as the first sub-array (array A) and an array in which the positional relationship of the R filters and the B filters in the array pattern shown in FIG. 24(*a*) is inverted is used as the second sub-array (array B), and these first and second sub-arrays are disposed in parallel. Further, it is also possible to use as a basic array pattern P11', an array pattern corresponding to 8×8 pixels shown in FIG. 24(*c*), which includes two first sub-arrays and two second sub-arrays and in which the first sub-arrays are disposed on one of diagonals and the second sub-arrays are disposed in the other of the diagonals.

The color filters having these basic array patterns include a square array corresponding to 2×2 pixels in which a G filter 23G is provided. By extracting 2×2 pixels G corresponding to this square array and obtaining a difference absolute value of pixel values of pixels G in the horizontal direction, a difference absolute value of pixel values of pixels G in the vertical direction, and a difference absolute value of pixel values of pixels G in the diagonal directions (NE and NW), it is possible to judge that there is correlation in a direction with a smaller difference absolute value among the horizontal direction, the vertical direction and the diagonal directions. As a result, in the color filter array, it is possible to judge a direction with high correlation among the horizontal direction, the vertical direction and the diagonal directions using information of the pixels G with minimum pixel spacing. This direction judgment result can be used in processing for interpolating a pixel from peripheral pixels (de-mosaic processing).

It should be noted that while the basic array pattern may be arranged in an array pattern corresponding to the other numbers of pixels, increase in the number of pixels of the basic array pattern makes signal processing such as de-mosaic processing complicated, while increase in the size of the basic array pattern provides no special advantages. Therefore, in order to prevent signal processing from becoming complicated, the size of the basic array pattern is preferably not too large, 8×8 pixels or smaller, and the basic array pattern corresponding to 3×3 pixels is more preferable in terms of simplification of signal processing.

It goes without saying that the color filter array of the color imaging element of the present invention is not limited to the above-described embodiments, and various modification can be made without departing from the scope of the present invention. For example, the arrays of the color filters in the above-described embodiments and the modified example may be combined as appropriate. Further, it is also possible to use as the first filter of the present invention, a filter combining at least any two types of a G filter 23G, a transparent filter W, the first and the second G filters 23G1 and 23G2, an emerald filter, and the like, or it is possible to use filters of other colors which satisfy any of the above-described conditions (1) to (4). Still further, it is also possible to use color filters other than the RB filters 23R and 23B as the second filter of the present invention.

Further, while a color imaging element mounted on a digital camera has been described in the above-described respective embodiments, the present invention can be applied to color imaging elements mounted on various electronic equipment (imaging devices) having imaging functions, such as, for example, smartphones, mobile phones and PDAs.

What is claimed is:

1. A single plate color imaging element, comprising:
   a plurality of pixels comprised of photoelectric conversion elements arranged in a first direction and in a second direction perpendicular to the first direction; and
   color filters disposed on the plurality of pixels, wherein
   an array of the color filters comprises a basic array pattern in which the color filters are arranged in an array pattern corresponding to M×M (where M is an integer of three or greater) pixels in the first direction and in the second direction, the basic array pattern being repeatedly disposed in the first direction and in the second direction,
   the color filters comprise a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of the number of pixels of each color of the second color corresponding to the second filter,
   in the basic array pattern, the first filter is disposed in a peripheral portion configuring two adjacent sides among four sides of the array pattern corresponding to M×M (where M is an integer of three or greater) pixels, and
   the second filter is disposed in a portion other than the peripheral portion configuring the two sides such that a ratio of the number of pixels of the second color is higher than a ratio of the number of pixels of the first color in the portion other than the peripheral portion configuring the two sides.

2. The color imaging element according to claim 1, wherein ratios of respective colors of the second color are the same in the second filter disposed in the portion other than the peripheral portion configuring the two sides of the basic array pattern.

3. The color imaging element according to claim 1, wherein
   the second color is comprised of two colors including a first constituting color and a second constituting color,
   the second filter corresponding to the first constituting color is disposed in parallel in one of diagonal directions in the portion other than the peripheral portion configuring the two sides of the basic array pattern, and
   the second filter corresponding to the second constituting color is disposed in parallel in the other of the diagonal directions in the portion other than the peripheral portion configuring the two sides of the basic array pattern.

4. The color imaging element according to claim 1, wherein the M is 3.

5. The color imaging element according to claim 1, wherein the contribution ratio of the first color to obtain the brightness signal is 50% or higher, and the contribution ratio of the second color to obtain the brightness signal is lower than 50%.

6. The color imaging element according to claim 1, wherein the first color comprises at least one of green and transparence.

7. The color imaging element according to claim 1, wherein the second color comprises red and blue.

8. A single plate color imaging element, comprising:
   a plurality of pixels comprised of photoelectric conversion elements arranged in a first direction and in a second direction perpendicular to the first direction; and
   color filters disposed on the plurality of pixels, wherein
   an array of the color filters comprises a basic array pattern in which the color filters are arranged in an array pattern corresponding to M×N (where M is an integer of three or greater, and N is an even number of six or greater) pixels in the first direction and in the second direction, the basic array pattern being repeatedly disposed in the first direction and in the second direction,
   the basic array pattern comprises two types of a first sub-array and a second sub-array, in each of the first sub-array and the second sub-array, the color filters are arranged in an array pattern corresponding to M×(N/2) pixels,
   the color filters comprise a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of the number of pixels of each color of the second color corresponding to the second filter,
   in each of the first sub-array and the second sub-array, the first filter is disposed in a peripheral portion configuring two adjacent sides among four sides of the array pattern corresponding to M×(N/2) pixels, and
   the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array and the second sub-array.

9. The color imaging element according to claim 8, wherein ratios of respective colors of the second color are the same in the second filter disposed in the portion other than the peripheral portion configuring two sides of each of the sub-arrays.

10. The color imaging element according to claim 8, wherein, in the portion other than the peripheral portion configuring the two sides of each of the sub-arrays, arrangement of the second filter corresponding to each color of the second color is different between the sub-arrays included in the basic array pattern.

11. The color imaging element according to claim 8, wherein
    the second color is comprised of two colors including a first constituting color and a second constituting color,
    the second filter corresponding to the first constituting color is arranged in parallel in one of diagonal directions in the portion other than the peripheral portion configuring two sides of each of the first sub-array and the second sub-array, and
    the second filter corresponding to the second constituting color is arranged in parallel in the other of the diagonal directions in the portion other than the peripheral portion configuring the two sides of each of the first sub-array and the second sub-array.

12. The color imaging element according to claim 8, wherein the second filter corresponding to all the colors constituting the second color and the first filter are disposed on a diagonal filter line extending in a third direction and in a fourth direction which are tilted with respect to the first direction and the second direction in the color filters, the diagonal filter line corresponding to six or more pixels.

13. The color imaging element according to claim 8, wherein the M is six.

14. The color imaging element according to claim 8 wherein the M is three, and the N is six.

15. A single plate color imaging element, comprising:
a plurality of pixels comprised of photoelectric conversion elements arranged in a first direction and in a second direction perpendicular to the first direction; and
color filters disposed on the plurality of pixels, wherein
an array of the color filters comprises a basic array pattern in which the color filters are arranged in an array pattern corresponding to M×M (where M is an even number of six or greater) pixels in the first direction and in the second direction, the basic array pattern being repeatedly disposed in the first direction and in the second direction,
the basic array pattern comprises two first sub-arrays and two second sub-arrays which are two types of sub-arrays, in each of the first sub-arrays and the second sub-arrays, the color filters are arranged in an array pattern corresponding to (M/2)×(M/2) pixels,
the color filters comprise a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of each number of pixels of each color of the second color corresponding to the second filter,
in each of the first sub-arrays and the second sub-arrays, the first filter is disposed in a peripheral portion configuring two adjacent sides among four sides of the array pattern corresponding to (M/2)×(M/2) pixels, and
the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-arrays and the second sub-arrays.

16. A single plate color imaging element, comprising:
a plurality of pixels comprised of photoelectric conversion elements arranged in a first direction and in a second direction perpendicular to the first direction; and
color filters disposed on the plurality of pixels, wherein
an array of the color filters comprises a basic array pattern in which the color filters are arranged in an array pattern corresponding to M×M (where M is an even number of six or greater) pixels in the first direction and in the second direction, the basic array pattern being repeatedly disposed in the first direction and in the second direction,
the basic array pattern comprises four types of a first sub-array, a second sub-array, a third sub-array and a fourth sub-array, in each of the first sub-array, the second sub-array, the third sub-array and the fourth sub-array, the color filters are arranged in an array pattern corresponding to (M/2)×(M/2) pixels,
the color filters comprise a first filter corresponding to a first color of one or more colors and a second filter corresponding to a second color of two or more colors, the second color having a lower contribution ratio to obtain a brightness signal than the first color, a ratio of the number of all pixels of the first color corresponding to the first filter is higher than a ratio of each number of pixels of each color of the second color corresponding to the second filter,
in each of the first sub-array, the second sub-array, the third sub-array and the fourth sub-array, the first filter is disposed in a peripheral portion configuring two adjacent sides among four sides of an array pattern corresponding to (M/2)×(M/2) pixels, and
the second filter is disposed in a portion other than the peripheral portion configuring the two sides such that a ratio of the number of pixels of the second color is higher than a ratio of the number of pixels of the first color in the portion other than the peripheral portion configuring the two sides in each of the first sub-array, the second sub-array, the third sub-array and the fourth sub-array.

17. An imaging device comprising:
an imaging optical system;
a color imaging element at which a subject image is formed through the imaging optical system; and
an image data generating unit that generates image data indicating the formed subject image,
wherein the color imaging element is the color imaging element according to claim 1.

* * * * *